(12) United States Patent
Choi et al.

(10) Patent No.: US 9,624,580 B2
(45) Date of Patent: Apr. 18, 2017

(54) THIN FILM DEPOSITION APPARATUS

(71) Applicant: SAMSUNG DISPLAY CO., LTD., Yongin-si, Gyeonggi-do (KR)

(72) Inventors: Young-Mook Choi, Yongin-si (KR); Chang-Mog Jo, Yongin-si (KR); Hee-Cheol Kang, Yongin-si (KR); Hyun-Sook Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 481 days.

(21) Appl. No.: 14/203,212

(22) Filed: Mar. 10, 2014

(65) Prior Publication Data

US 2014/0193581 A1 Jul. 10, 2014

Related U.S. Application Data

(62) Division of application No. 12/873,689, filed on Sep. 1, 2010, now Pat. No. 8,696,815.

(30) Foreign Application Priority Data

Sep. 1, 2009 (KR) .................. 10-2009-0081979
Feb. 17, 2010 (KR) .................. 10-2010-0014276

(51) Int. Cl.
C23C 16/52 (2006.01)
C23C 14/04 (2006.01)
(Continued)

(52) U.S. Cl.
CPC ............ *C23C 16/52* (2013.01); *C23C 14/042* (2013.01); *C23C 14/12* (2013.01); *C23C 14/243* (2013.01); *H01L 51/0011* (2013.01); *H01L 51/56* (2013.01)

(58) Field of Classification Search
None
See application file for complete search history.

(56) References Cited

U.S. PATENT DOCUMENTS 4,687,939 A 8/1987 Miyauchi et al.
4,805,761 A 2/1989 Totsch
(Continued)

FOREIGN PATENT DOCUMENTS

EP 1 413 644 A2 4/2004
EP 1 418 250 A2 5/2004
(Continued)

OTHER PUBLICATIONS

English Abstract, Publication No. 1020080002189, dated Jan. 4, 2008, for corresponding Korean Patent 10-0800125 listed above.
(Continued)

*Primary Examiner* — Joseph Miller, Jr.
(74) *Attorney, Agent, or Firm* — Lewis Roca Rothgerber Christie LLP

(57) ABSTRACT

A method for forming a thin film on a substrate includes discharging a deposition material from a deposition source through a plurality of deposition source nozzles arranged in a first direction on a deposition source nozzle unit disposed at a side of the deposition source; passing the deposition material through a patterning slit sheet; and depositing the deposition material on the substrate, while moving the substrate and the patterning slit sheet relative to each other. The patterning slit sheet is spaced apart from the substrate by a distance. A blocking member is disposed between the substrate and the deposition source and is moved along with the substrate to be positioned to screen at least one portion of the substrate, and the patterning slit sheet is disposed opposite to and spaced apart from the deposition source nozzle unit, and includes a plurality of patterning slits arranged in the first direction.

17 Claims, 20 Drawing Sheets

(51) Int. Cl.
  *C23C 14/12* (2006.01)
  *C23C 14/24* (2006.01)
  *H01L 51/00* (2006.01)
  *H01L 51/56* (2006.01)

(56) References Cited

U.S. PATENT DOCUMENTS

| | | | |
|---|---|---|---|
| 4,901,667 A | 2/1990 | Suzuki et al. | |
| 5,360,470 A | 11/1994 | Ono et al. | |
| 5,377,596 A | 1/1995 | Ono et al. | |
| 5,601,027 A | 2/1997 | Shinozaki et al. | |
| 5,909,995 A | 6/1999 | Wolf et al. | |
| 6,045,671 A | 4/2000 | Wu et al. | |
| 6,091,195 A | 7/2000 | Forrest et al. | |
| 6,184,596 B1 | 2/2001 | Ohzeki | |
| 6,271,606 B1 | 8/2001 | Hazelton | |
| 6,274,198 B1 | 8/2001 | Dautartas | |
| 6,280,821 B1 | 8/2001 | Kadunce et al. | |
| 6,371,451 B1 | 4/2002 | Choi | |
| 6,579,422 B1 | 6/2003 | Kakinuma | |
| 6,684,794 B2 | 2/2004 | Fiske et al. | |
| 6,749,906 B2 | 6/2004 | Van Slyke | |
| 6,837,939 B1* | 1/2005 | Klug | C23C 14/12 118/726 |
| 6,878,209 B2 | 4/2005 | Himeshima et al. | |
| 6,946,783 B2 | 9/2005 | Kim | |
| 7,006,202 B2 | 2/2006 | Byun et al. | |
| 7,575,406 B2 | 8/2009 | Hofmeister et al. | |
| 7,622,006 B2 | 11/2009 | Ishizawa et al. | |
| 7,954,434 B2 | 6/2011 | Yeo et al. | |
| 7,988,398 B2 | 8/2011 | Hofmeister et al. | |
| 8,188,476 B2 | 5/2012 | Takagi et al. | |
| 8,192,546 B2 | 6/2012 | Kim et al. | |
| 8,193,011 B2 | 6/2012 | Kang et al. | |
| 9,246,377 B2 | 1/2016 | Fukasawa et al. | |
| 2001/0006827 A1 | 7/2001 | Yamazaki et al. | |
| 2001/0019807 A1 | 9/2001 | Yamada et al. | |
| 2001/0026638 A1 | 10/2001 | Sangu et al. | |
| 2001/0026748 A1 | 10/2001 | Blonigan et al. | |
| 2002/0017245 A1 | 2/2002 | Tsubaki et al. | |
| 2002/0076847 A1 | 6/2002 | Yamada et al. | |
| 2002/0168577 A1 | 11/2002 | Yoon | |
| 2003/0017258 A1* | 1/2003 | Yamada | C23C 14/042 427/66 |
| 2003/0045098 A1 | 3/2003 | Verhaverbeke et al. | |
| 2003/0087033 A1* | 5/2003 | Ramsay | C23C 14/042 427/282 |
| 2003/0101932 A1 | 6/2003 | Kang | |
| 2003/0101937 A1 | 6/2003 | Van Slyke et al. | |
| 2003/0118950 A1 | 6/2003 | Chao et al. | |
| 2003/0168013 A1 | 9/2003 | Freeman et al. | |
| 2003/0221614 A1 | 12/2003 | Kang et al. | |
| 2003/0221620 A1 | 12/2003 | Yamazaki | |
| 2003/0232563 A1 | 12/2003 | Kamiyama et al. | |
| 2004/0029028 A1 | 2/2004 | Shimizu | |
| 2004/0035366 A1* | 2/2004 | Keum | C23C 14/12 118/726 |
| 2004/0056244 A1 | 3/2004 | Marcus et al. | |
| 2004/0086639 A1 | 5/2004 | Grantham et al. | |
| 2004/0115338 A1* | 6/2004 | Yoneda | C23C 14/042 427/66 |
| 2004/0115342 A1 | 6/2004 | Shigemura | |
| 2004/0119358 A1 | 6/2004 | Thornton et al. | |
| 2004/0127066 A1 | 7/2004 | Jung | |
| 2004/0134428 A1 | 7/2004 | Sasaki et al. | |
| 2004/0142108 A1 | 7/2004 | Atobe et al. | |
| 2004/0144321 A1 | 7/2004 | Grace et al. | |
| 2004/0183435 A1 | 9/2004 | Ohshita | |
| 2004/0194702 A1 | 10/2004 | Sasaki et al. | |
| 2004/0195530 A1 | 10/2004 | Kwak et al. | |
| 2004/0216673 A1 | 11/2004 | Sakata et al. | |
| 2005/0016461 A1 | 1/2005 | Klug et al. | |
| 2005/0031836 A1 | 2/2005 | Hirai | |
| 2005/0037136 A1 | 2/2005 | Yamamoto | |
| 2005/0072361 A1 | 4/2005 | Yang et al. | |
| 2005/0110400 A1 | 5/2005 | Nakamura | |
| 2005/0129489 A1 | 6/2005 | Quan et al. | |
| 2005/0153472 A1 | 7/2005 | Yotsuya | |
| 2005/0166842 A1 | 8/2005 | Sakamoto | |
| 2005/0229848 A1 | 10/2005 | Shinriki et al. | |
| 2005/0263074 A1 | 12/2005 | Masuda et al. | |
| 2006/0011136 A1 | 1/2006 | Yamazaki et al. | |
| 2006/0022590 A1 | 2/2006 | Aziz et al. | |
| 2006/0090705 A1 | 5/2006 | Kim | |
| 2006/0110544 A1 | 5/2006 | Kim et al. | |
| 2006/0113907 A1 | 6/2006 | Im et al. | |
| 2006/0144325 A1 | 7/2006 | Jung et al. | |
| 2006/0174829 A1 | 8/2006 | An et al. | |
| 2006/0194435 A1 | 8/2006 | Nishimura et al. | |
| 2006/0205101 A1 | 9/2006 | Lee et al. | |
| 2006/0272572 A1 | 12/2006 | Uematsu et al. | |
| 2007/0022955 A1 | 2/2007 | Bender et al. | |
| 2007/0054044 A1 | 3/2007 | Shimosaki et al. | |
| 2007/0054051 A1 | 3/2007 | Arai et al. | |
| 2007/0077358 A1 | 4/2007 | Jeong et al. | |
| 2007/0148337 A1 | 6/2007 | Nichols et al. | |
| 2007/0157879 A1 | 7/2007 | Yotsuya | |
| 2007/0163497 A1 | 7/2007 | Grace et al. | |
| 2007/0178708 A1 | 8/2007 | Ukigaya | |
| 2007/0231460 A1 | 10/2007 | Ukigaya | |
| 2008/0018236 A1 | 1/2008 | Arai et al. | |
| 2008/0100201 A1 | 5/2008 | Wei et al. | |
| 2008/0115729 A1 | 5/2008 | Oda et al. | |
| 2008/0129194 A1 | 6/2008 | Abe et al. | |
| 2008/0131587 A1 | 6/2008 | Boroson et al. | |
| 2008/0145521 A1 | 6/2008 | Guo et al. | |
| 2008/0174235 A1 | 7/2008 | Kim et al. | |
| 2008/0216741 A1 | 9/2008 | Ling et al. | |
| 2008/0238294 A1 | 10/2008 | Xu et al. | |
| 2009/0017192 A1 | 1/2009 | Matsuura | |
| 2009/0208754 A1 | 8/2009 | Chu et al. | |
| 2009/0220691 A1 | 9/2009 | Kim | |
| 2009/0229524 A1 | 9/2009 | Kim et al. | |
| 2009/0232976 A1 | 9/2009 | Yoon et al. | |
| 2009/0277386 A1 | 11/2009 | Takagi et al. | |
| 2010/0001301 A1 | 1/2010 | Karg et al. | |
| 2010/0043712 A1 | 2/2010 | Tobe et al. | |
| 2010/0055810 A1 | 3/2010 | Sung et al. | |
| 2010/0192856 A1 | 8/2010 | Sung et al. | |
| 2010/0196607 A1 | 8/2010 | Carlson et al. | |
| 2010/0239746 A1 | 9/2010 | Yamazaki et al. | |
| 2010/0271602 A1 | 10/2010 | Hanazaki | |
| 2010/0297349 A1 | 11/2010 | Lee et al. | |
| 2011/0052791 A1 | 3/2011 | Jo et al. | |
| 2011/0220019 A1 | 9/2011 | Lee et al. | |
| 2012/0009328 A1 | 1/2012 | Ryu et al. | |
| 2012/0145077 A1 | 6/2012 | Chang et al. | |

FOREIGN PATENT DOCUMENTS

| | | |
|---|---|---|
| EP | 1418250 A2 * | 5/2004 |
| EP | 1 518 940 A1 | 3/2005 |
| JP | 53-113782 | 10/1978 |
| JP | 04-272170 | 9/1992 |
| JP | 05-230628 | 9/1993 |
| JP | 08-027568 | 1/1996 |
| JP | 09-017846 | 1/1997 |
| JP | 09-095776 | 4/1997 |
| JP | 2000-068054 | 3/2000 |
| JP | 2001-052862 | 2/2001 |
| JP | 2001-093667 | 4/2001 |
| JP | 2002-075638 | 3/2002 |
| JP | 2002-175878 | 6/2002 |
| JP | 2003-003250 | 1/2003 |
| JP | 2003-077662 | 3/2003 |
| JP | 2003-157973 | 5/2003 |
| JP | 2003-297562 | 10/2003 |
| JP | 2003-197531 | 11/2003 |
| JP | 2003-321767 | 11/2003 |
| JP | 2004-035964 | 2/2004 |
| JP | 2004-043898 | 2/2004 |
| JP | 2004-076150 | 3/2004 |
| JP | 2004-103269 | 4/2004 |
| JP | 2004-103341 | 4/2004 |

(56) References Cited

FOREIGN PATENT DOCUMENTS

| | | |
|---|---|---|
| JP | 2004-137583 | 5/2004 |
| JP | 2004-169169 | 6/2004 |
| JP | 2004-199919 | 7/2004 |
| JP | 2004-349101 | 12/2004 |
| JP | 2005-044592 | 2/2005 |
| JP | 2005-122980 | 5/2005 |
| JP | 2005-165015 | 6/2005 |
| JP | 2005-174843 | 6/2005 |
| JP | 2005-206939 | 8/2005 |
| JP | 2005-235568 | 9/2005 |
| JP | 2005-293968 | 10/2005 |
| JP | 2005-296737 | 10/2005 |
| JP | 2006-028583 | 2/2006 |
| JP | 2006-172930 | 6/2006 |
| JP | 2006-176809 | 7/2006 |
| JP | 2006-210038 | 8/2006 |
| JP | 2006-275433 | 10/2006 |
| JP | 2006-292955 | 10/2006 |
| JP | 2007-047293 | 2/2007 |
| JP | 2007-186740 | 7/2007 |
| JP | 2007-291506 | 11/2007 |
| JP | 2008-108628 | 5/2008 |
| JP | 2008-121098 | 5/2008 |
| JP | 2008-521165 | 6/2008 |
| JP | 2009-019243 | 1/2009 |
| JP | 2009-024208 | 2/2009 |
| JP | 2009-081165 | 4/2009 |
| JP | 2009-87910 | 4/2009 |
| JP | 2010-261081 | 11/2010 |
| KR | 10-0257219 13 | 2/2000 |
| KR | 10-2000-0019254 | 4/2000 |
| KR | 10-2000-0023929 | 5/2000 |
| KR | 10-2001-0024652 | 3/2001 |
| KR | 10-2001-0059939 | 7/2001 |
| KR | 10-2001-0092914 | 10/2001 |
| KR | 10-2001-0093666 | 10/2001 |
| KR | 20-0257218 Y1 | 12/2001 |
| KR | 10-2002-0000201 | 1/2002 |
| KR | 10-2002-0001555 | 1/2002 |
| KR | 10-2002-0050922 | 6/2002 |
| KR | 10-2002-0090934 | 12/2002 |
| KR | 10-2003-0001745 | 1/2003 |
| KR | 10-2003-0034730 | 5/2003 |
| KR | 10-2003-0046090 | 6/2003 |
| KR | 2003-0069684 | 8/2003 |
| KR | 10-0405080 B1 | 11/2003 |
| KR | 10-2003-0091947 | 12/2003 |
| KR | 10-2003-0093959 | 12/2003 |
| KR | 2003-0094033 | 12/2003 |
| KR | 10-2004-0014258 | 2/2004 |
| KR | 10-2004-0034537 | 4/2004 |
| KR | 10-2004-0050045 | 6/2004 |
| KR | 10-2004-0069281 | 8/2004 |
| KR | 10-2004-0084747 | 10/2004 |
| KR | 10-2004-0087142 | 10/2004 |
| KR | 10-0463212 B1 | 12/2004 |
| KR | 10-2005-0062853 | 6/2005 |
| KR | 10-0520159 BI | 10/2005 |
| KR | 10-2006-0008602 | 1/2006 |
| KR | 10-2006-0018745 | 3/2006 |
| KR | 10-2006-0020050 | 3/2006 |
| KR | 10-2006-0049050 | 5/2006 |
| KR | 10-2006-0056706 | 5/2006 |
| KR | 10-2006-0058459 | 5/2006 |
| KR | 10-2006-0059068 | 6/2006 |
| KR | 10-2006-0065978 | 6/2006 |
| KR | 10-2006-0073367 | 6/2006 |
| KR | 10-2006-0080475 | 7/2006 |
| KR | 10-2006-0080481 | 7/2006 |
| KR | 10-2006-0080482 | 7/2006 |
| KR | 10-2006-0083510 | 7/2006 |
| KR | 10-2006-0092387 | 8/2006 |
| KR | 10-2006-0098755 | 9/2006 |
| KR | 10-2006-0104288 | 10/2006 |
| KR | 10-2006-0104675 | 10/2006 |
| KR | 10-2006-0104677 | 10/2006 |
| KR | 10-2006-0109627 | 10/2006 |
| KR | 10-0635903 B1 | 10/2006 |
| KR | 10-2006-0114462 | 11/2006 |
| KR | 10-0645719 B1 | 11/2006 |
| KR | 10-0646160 B1 | 11/2006 |
| KR | 10-2006-0123944 | 12/2006 |
| KR | 10-0687007 13 | 2/2007 |
| KR | 10-2007-0025164 | 3/2007 |
| KR | 10-0696547 B1 | 3/2007 |
| KR | 10-0696550 13 | 3/2007 |
| KR | 10-0697663 13 | 3/2007 |
| KR | 10-0698033 13 | 3/2007 |
| KR | 10-0700466 B1 | 3/2007 |
| KR | 10-2007-0035796 | 4/2007 |
| KR | 10-0711885 B1 | 4/2007 |
| KR | 10-0723627 B1 | 5/2007 |
| KR | 10-0726132 B1 | 6/2007 |
| KR | 10-0739309 B1 | 7/2007 |
| KR | 10-2007-0078713 | 8/2007 |
| KR | 10-2007-0080635 | 8/2007 |
| KR | 10-2007-0101842 | 10/2007 |
| KR | 10-2007-0105595 | 10/2007 |
| KR | 10-0768212 | 10/2007 |
| KR | 10-0770653 B1 | 10/2007 |
| KR | 10-2007-0112668 | 11/2007 |
| KR | 10-0787457 B1 | 12/2007 |
| KR | 10-2008-0001184 | 1/2008 |
| KR | 10-2008-0003720 | 1/2008 |
| KR | 10-0797787 B1 | 1/2008 |
| KR | 10-0800125 | 1/2008 |
| KR | 10-0815265 B1 | 3/2008 |
| KR | 10-2008-0036983 | 4/2008 |
| KR | 10-0823508 B1 | 4/2008 |
| KR | 10-2008-0044775 | 5/2008 |
| KR | 10-0827760 B1 | 5/2008 |
| KR | 10-2008-0048653 | 6/2008 |
| KR | 10-2008-0055124 | 6/2008 |
| KR | 10-0839380 B1 | 6/2008 |
| KR | 10-2008-0060400 | 7/2008 |
| KR | 10-2008-0061132 | 7/2008 |
| KR | 10-2008-0061666 | 7/2008 |
| KR | 10-2008-0061774 | 7/2008 |
| KR | 10-2008-0062212 | 7/2008 |
| KR | 10-2008-0109559 | 12/2008 |
| KR | 10-2009-0038733 | 4/2009 |
| KR | 10-2009-0040618 | 4/2009 |
| KR | 10-2009-0052155 | 5/2009 |
| KR | 10-2009-0053417 | 5/2009 |
| KR | 10-2009-0066996 | 6/2009 |
| KR | 10-0908232 B1 | 7/2009 |
| KR | 10-2009-0093161 | 9/2009 |
| KR | 10-2009-0097453 | 9/2009 |
| KR | 10-2010-0000128 | 1/2010 |
| KR | 10-2010-0000129 | 1/2010 |
| KR | 10-2010-0026655 | 3/2010 |
| KR | 10-2010-0047796 | 5/2010 |
| KR | 10-2010-0090070 | 8/2010 |
| KR | 10-2010-0099806 | 9/2010 |
| KR | 10-2010-0126125 | 10/2010 |
| KR | 10-2011-0101767 | 9/2011 |
| KR | 10-2012-0006324 | 1/2012 |
| KR | 10-2012-0065789 | 6/2012 |
| WO | WO 57-194252 | 11/1982 |
| WO | WO 99/25894 | 5/1999 |
| WO | WO 2008/004792 A1 | 1/2008 |

OTHER PUBLICATIONS

Japanese Office action dated Aug. 21, 2012 for Japanese Patent application 2010-145075, (5 pages).

Japanese Office action dated Sep. 4, 2012 for Japanese Patent application 2010-152846, (4 pages).

KIPO Notice of Allowance dated Apr. 30, 2012 for Korean Patent application 10-2010-0066992, (5 pages).

KIPO Notice of Allowance dated Aug. 24, 2012 for Korean Patent application 10-2010-0066993, (5 pages).

(56) References Cited

OTHER PUBLICATIONS

KIPO Notice of Allowance dated Jul. 20, 2012 for Korean Patent application 10-2010-0003545, (5 pages).
KIPO Notice of Allowance dated Nov. 25, 2011 for Korean Patent application 10-2010-0014277, (5 pages).
KIPO Notice of Allowance dated Sep. 1, 2012 for Korean Patent application 10-2010-0014276, (5 pages).
KIPO Notice of Allowance dated Sep. 1, 2012 for Korean Patent application 10-2010-0013848, (5 pages).
KIPO Notice of Allowance dated Sep. 1, 2012 for Korean Patent application 10-2010-0009160, (5 pages).
KIPO Notice of Allowance dated Sep. 28, 2011 for Korean Patent application 10-2009-0052357, (5 pages).
KIPO Office action dated Apr. 2, 2012 for Korean Patent application 10-2010-0066993, (4 pages).
KIPO Office action dated Aug. 1, 2011 for Korean Patent application 10-2009-0074001, (3 pages).
KIPO Office action dated Aug. 1, 2011, for Korean Patent application 10-2009-0073523, 3 pages.
KIPO Office action dated Aug. 28, 2012 for Korean Patent application 10-2010-0014274, (5 pages).
KIPO Office action dated Feb. 1, 2012 for Korean Patent application 10-2010-0014272, (4 pages).
KIPO Office action dated Feb. 1, 2012 for Korean Patent application 10-2010-0011196, (4 pages).
KIPO Office action dated Feb. 1, 2012 for Korean Patent application 10-2010-0013848, (4 pages).
KIPO Office action dated Feb. 6, 2012 for Korean Patent application 10-2010-0021835, (4 pages).
KIPO Office action dated Feb. 6, 2012, for Korean Patent application 10-2010-0014274, 9 pages.
KIPO Office action dated Jan. 13, 2012 for Korean Patent application 10-2009-0056529, (5 pages).
KIPO Office action dated Sep. 1, 2012 for Korean Patent application 10-2010-0010136, (5 pages).
KIPO Registration Determination Certificate dated Oct. 31, 2011, for Korean priority Patent application 10-2010-0014273, corresponding to cross reference U.S. Appl. No. 12/849,092, 5 pages.
Korean Patent Abstracts for Korean Publication 10-2007-0097218 dated Oct. 4, 2007, corresponding to Korean Patent 10-0768212 dated Oct. 18, 2007 listed above.
Korean Patent Abstracts, Publication No. 10-0151312 B1, dated Jun. 18, 1998, corresponding to Korean Publication 1997-0008709 listed above.
Korean Patent Abstracts, Publication No. 1020010062735, dated Jul. 7, 2001, for corresponding Korean Patent 10-0827760 listed above.
Korean Patent Abstracts, Publication No. 1020020034272, dated May 9, 2002, for corresponding Korean Patent 10-0726132 listed above.
Korean Patent Abstracts, Publication No. 1020020056238, dated Jul. 10, 2002, for corresponding Korean Patent 10-0698033 listed above.
Korean Patent Abstracts, Publication No. 1020020086047, dated Nov. 18, 2002, for corresponding Korean Patent 10-0405080 listed above.
Korean Patent Abstracts, Publication No. 1020020088662, dated Nov. 29, 2002, for corresponding Korean Patent 10-0463212 listed above.
Korean Patent Abstracts, Publication No. 1020040062203, dated Jul. 7, 2002, for corresponding Korean Patent 10-0646160 listed above.
Korean Patent Abstracts, Publication No. 1020050045619, dated May 17, 2005, for corresponding Korean Patent 10-0520159 listed above.
Korean Patent Abstracts, Publication No. 1020050078637, dated Aug. 5, 2005, for corresponding Korean Patent 10-0700466 listed above.
Korean Patent Abstracts, Publication No. 1020060101987, dated Sep. 27, 2006, for corresponding Korean Patent 10-0687007 listed above.
Korean Patent Abstracts, Publication No. 1020060126267, dated Dec. 6, 2006, for corresponding Korean Patent 10-0797787 listed above.
Korean Patent Abstracts, Publication No. 1020070025164, dated Mar. 8, 2007, for corresponding Korean Patent 10-0711885 listed above.
Korean Patent Abstracts. Publication No. 1020070050793, dated May 16, 2007, for corresponding Korean Patent 10-0815265 B1 listed above.
Korean Patent Abstracts, Publication No. 10-2007-0056241, dated Jun. 4, 2007, corresponding to Korean Patent 10-0741142 B1 listed above.
Korean Patent Abstracts, Publication No. 1020080038650, dated May 7, 2008, for corresponding Korean Patent 10-0839380 listed above.
Korean Patent Abstracts, Publication No. 10-2008-0070302, dated Jul. 30. 2008, corresponding to Korean Patent 10-0899279 B1 listed above.
Patent Abstracts of Japan, and English machine translation of Japanese Publication 2001-052862 listed above, (20 pages).
Patent Abstracts of Japan, and English machine translation of Japanese Publication 2003-003250 listed above, (25 pages).
Patent Abstracts of Japan and English machine translation of Japanese Publication 2004-349101 listed above, (11 pages).
Patent Abstracts of Japan, and English machine translation of Japanese Publication 2009-024208 listed above, (30 pages).
U.S. Notice of Allowance dated Mar. 18, 2013, for cross reference U.S. Appl. No. 12/795,001, (29 pages).
U.S. Office action dated Apr. 1, 2013, for cross reference U.S. Appl. No. 12/784/774, (44 pages).
U.S. Office action dated Aug. 13, 2013 for cross reference U.S. Appl. No. 13/194,759, (28 pages).
U.S. Office action dated Aug. 7, 2013, for cross reference U.S. Appl. No. 13/015,357, (30 pages).
U.S. Office action dated Dec. 17, 2012 for cross reference U.S. Appl. No. 12/873,556, (37 pages).
U.S. Office action dated Dec. 20, 2012 for cross reference U.S. Appl. No. 12/984,289, (20 pages).
U.S. Office action dated Dec. 26, 2012, for cross reference U.S. Appl. No. 12/815,673, (21 pages).
U.S. Office action dated Feb. 26, 2013, for cross reference U.S. Appl. No. 12/794,093, (31 pages).
U.S. Office action dated Jan. 25, 2013, for cross reference U.S. Appl. No. 13/015,357, (21 pages).
U.S. Office action dated Jul. 17, 2013, for cross reference U.S. Appl. No. 12/984,231, (18 pages).
U.S. Office action dated Jul. 5, 2013, for cross reference U.S. Appl. No. 12/873,556, (17 pages).
U.S. Office action dated Jun. 11, 2013 for cross reference U.S. Appl. No. 12/862,125, (37 pages).
U.S. Office action dated Jun. 26, 2013 for cross reference U.S. Appl. No. 12/794,093, (20 pages).
U.S. Office action dated Mar. 15, 2013, for cross reference U.S. Appl. No. 12/813,786, (33 pages).
U.S. Office action dated Mar. 18, 2013, for cross reference U.S. Appl. No. 12/984,231, (29 pages).
U.S. Office action dated Mar. 19, 2013, for cross reference U.S. Appl. No. 13/194,759, (36 pages).
U.S. Office action dated Mar. 22, 2013, for cross reference U.S. Appl. No. 12/987,569, (12 pages).
U.S. Office action dated May 24, 2013, for cross reference U.S. Appl. No. 12/849,092, (31 pages).
U.S. Office action dated May 7, 2013, for cross reference U.S. Appl. No. 12/820,270, (37 pages).
U.S. Office action dated Sep. 12, 2012 for cross reference U.S. Appl. No. 12/815,673, (26 pages).
EPO Office Action dated Dec. 17, 2015 for Application No. 12174739.8 (6 sheets).
JPO Office Action dated Apr. 5, 2016 for Application No. 2012-149279 (3 sheets).

(56) References Cited

OTHER PUBLICATIONS

U.S. Office Action dated Dec. 3, 2015 for U.S. Appl. No. 13/492,144 (33 sheets).
U.S. Office Action dated Dec. 31, 2015 for U.S. Appl. No. 14/012,924 (10 sheets).
U.S. Notice of Allowance dated Feb. 29, 2016 for U.S. Appl. No. 13/492,144 (10 sheets).
U.S. Office Action dated Apr. 21, 2016 for U.S. Appl. No. 14/012,924 (11 sheets).
U.S. Notice of Allowance dated Aug. 9, 2016 for U.S. Appl. No. 13/492,144 (9 sheets).
U.S. Notice of Allowance dated Aug. 24, 2016 for U.S. Appl. No. 14/012,924 (10 sheets).

* cited by examiner

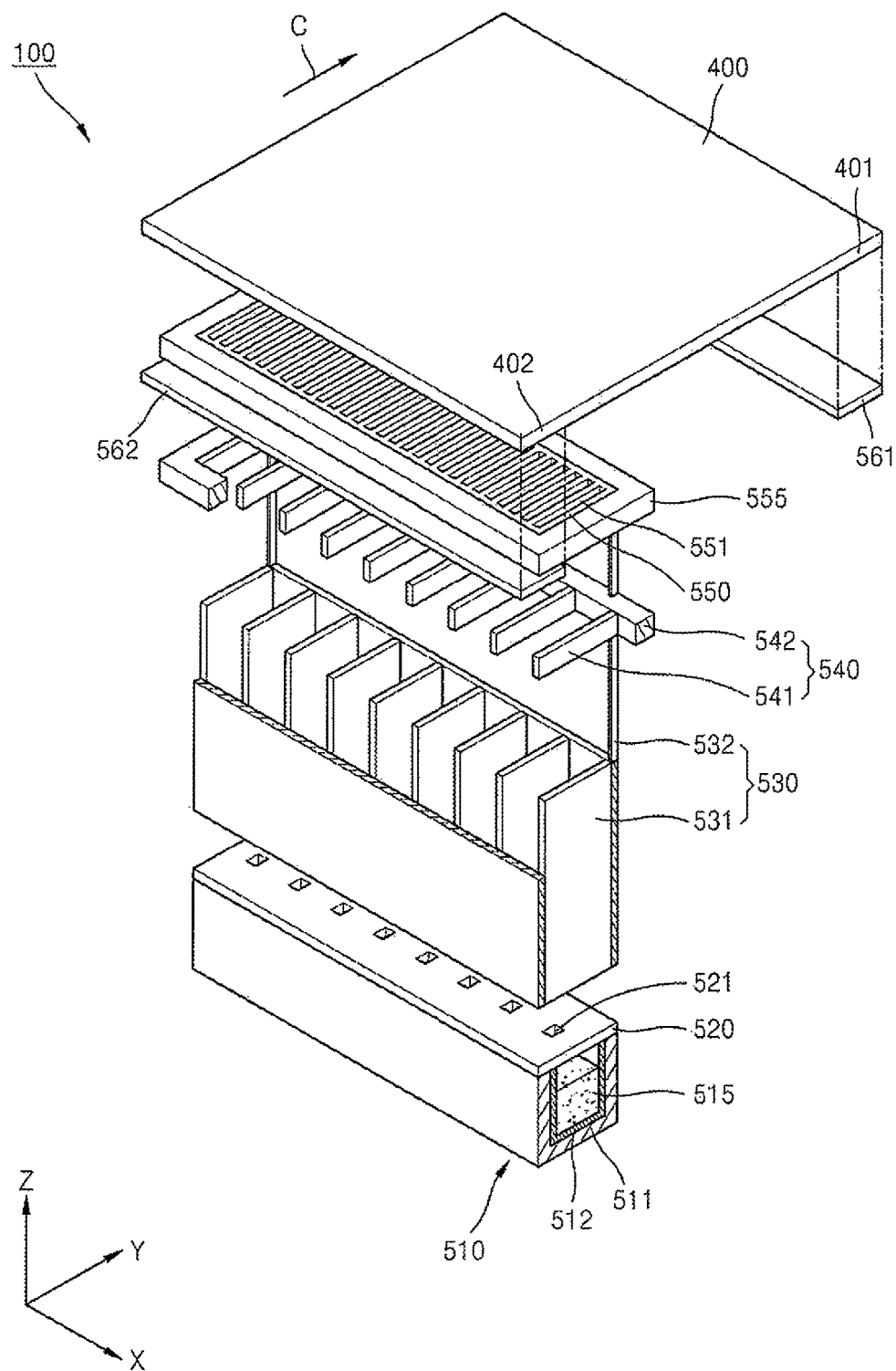

THIN FILM DEPOSITION APPARATUS

CROSS-REFERENCE TO RELATED APPLICATIONS

This application is a divisional of U.S. patent application Ser. No. 12/873,689, filed on Sep. 1, 2010, entitled "THIN FILM DEPOSITION APPARATUS," which claims priority to and the benefit of Korean Application Nos. 10-2009-0081979, filed on Sep. 1, 2009 and 10-2010-0014276, filed on Feb. 17, 2010, in the Korean Intellectual Property Office, the disclosures of all of which are incorporated herein by reference.

BACKGROUND OF THE INVENTION

1. Field of the Invention

Aspects of the present invention relates to a thin film deposition apparatus, and more particularly, to a thin film deposition apparatus that can be simply applied to manufacture thin films on the substrate on a mass scale and that improves manufacturing yield.

2. Description of the Related Art

Organic light-emitting display devices have a larger viewing angle, better contrast characteristics, and a faster response rate than other display devices, and thus have drawn attention as a next-generation display device.

In general, organic light-emitting display devices have a stacked structure including an anode, a cathode, and an emission layer interposed between the anode and the cathode, and display images in color when holes and electrons, injected respectively from the anode and the cathode, recombine in the emission layer such that light is emitted. However, it is difficult to achieve high light-emission efficiency with such a structure, and thus intermediate layers, including an electron injection layer, an electron transport layer, a hole transport layer, a hole injection layer, etc., may be additionally interposed between the emission layer and one or both of the electrodes.

Also, it is very difficult in practice to form fine patterns in organic thin films such as the emission layer and the intermediate layers, and red, green, and blue light-emission efficiency varies according to characteristics of the organic thin films. For these reasons, it is not easy to form an organic thin film pattern on a large substrate, such as a mother glass having a size of 5G or more, by using a conventional thin film deposition apparatus, and thus it is difficult to manufacture large organic light-emitting display devices having satisfactory driving voltage, current density, brightness, color purity, light-emission efficiency, life-span characteristics. Thus, there is a desire for improvement in this regard.

An organic light-emitting display device includes intermediate layers, including an emission layer disposed between a first electrode and a second electrode that are arranged opposite to each other. The electrodes and the intermediate layers may be formed by using various methods, one of which is a deposition method. When an organic light-emitting display device is manufactured by using the deposition method, a fine metal mask (FMM) having the same pattern as a thin film to be formed is disposed to closely contact a substrate, and a thin film material is deposited over the FMM in order to form the thin film having the desired pattern.

SUMMARY OF THE INVENTION

Aspects of the present invention provides a thin film deposition apparatus that may be easily manufactured, that may be simply applied to manufacture thin films on the substrate on a mass scale, that improves manufacturing yield and deposition efficiency, and that allows deposited materials to be reused.

According to an aspect of the present invention, there is provided a thin film deposition apparatus that forms a thin film on a substrate, the apparatus including: a deposition source that discharges a deposition material; a deposition source nozzle unit that is disposed at a side of the deposition source and includes a plurality of deposition source nozzles arranged in a first direction; a patterning slit sheet that is disposed opposite to the deposition source nozzle unit and includes a plurality of patterning slits arranged in the first direction; a barrier plate assembly that is disposed between the deposition source nozzle unit and, and includes a plurality of barrier plates in the first direction that partition a space between the deposition source nozzle unit and the patterning slit sheet into a plurality of sub-deposition spaces; and a blocking member that is disposed between the substrate and the deposition source and that is spaced apart from the substrate, wherein the thin film deposition apparatus is spaced apart from the substrate by a predetermined distance, the substrate and the thin film deposition apparatus move relative to each other, and when the substrate and the thin film deposition apparatus are moved relative to each other, the blocking member is moved along with the substrate to be positioned to screen at least one portion of the substrate.

According to a non-limiting aspect, the blocking member may screen a non-deposition region of the substrate.

According to a non-limiting aspect, the blocking member may screen edges of the substrate.

According to a non-limiting aspect, the blocking member may be positioned to move between the barrier plate assembly and the pattern slit sheet.

According to a non-limiting aspect, the blocking member may include a first blocking member that screens a first non-deposition region formed at a first end of the substrate and a second blocking member that screens a second non-deposition region formed at a second end of the substrate.

According to a non-limiting aspect, the first and second blocking members may have a flat plate shape.

According to a non-limiting aspect, the first and second blocking members may be moved along with the substrate such that the first blocking member is disposed to block deposition on the first non-deposition region, and the second blocking member is disposed to block deposition on the second non-deposition region.

According to a non-limiting aspect, the first and second blocking members may be moved at the same speed as that of the substrate.

According to a non-limiting aspect, positions of the first and second blocking members with respect to the substrate may be constantly maintained.

According to a non-limiting aspect, the first and second blocking members may have a U-shaped cross-section.

According to a non-limiting aspect, one of the first and second blocking members may have a U-shaped cross-section, and the other of the first and second blocking members may have an L-shaped cross-section.

According to a non-limiting aspect, the first and second blocking members may overlap with each other when deposition is not being performed on the substrate.

According to a non-limiting aspect, the first and second blocking members may be moved along with the substrate such that the first blocking member screens the first non-deposition region while the first blocking member is moved between the blocking plate assembly and the patterning slit sheet, and the second blocking member screens the second non-deposition region while the second blocking member is moved between the blocking plate assembly and the patterning slit sheet.

According to a non-limiting aspect, the first blocking member may be moved at the same speed as that of the substrate while the first blocking member is moved between the barrier plate assembly and the patterning slit sheet, and the second blocking member may be moved at the same speed as that of the substrate while the second blocking member is moved between the barrier plate assembly and the patterning slit sheet.

According to a non-limiting aspect, t position of the first blocking member with respect to the substrate may be constantly maintained while the first blocking member is moved between the barrier plate assembly and the patterning slit sheet, and a position of the second blocking member with respect to the substrate may be constantly maintained while the second blocking member is moved between the barrier plate assembly and the patterning slit sheet.

According to a non-limiting aspect, the patterning slit sheet may be smaller than the substrate.

According to a non-limiting aspect, each of the plurality of barrier plates may extend in a second direction that is substantially perpendicular to the first direction.

According to a non-limiting aspect, each of the barrier plate assemblies may include a first barrier plate assembly including a plurality of first barrier plates, and a second barrier plate assembly including a plurality of second barrier plates.

According to a non-limiting aspect, the deposition material contained in the deposition source of thin film deposition apparatus may be continuously deposited on the substrate while the substrate is moved relative to the thin film deposition apparatus.

According to a non-limiting aspect, the thin film deposition apparatus or the substrate may move relative to each other along a plane parallel to a surface of the substrate on which the deposition materials are deposited.

According to an aspect of the present invention, there is provided a thin film deposition apparatus for forming a thin film on a substrate, the apparatus including: a deposition source that discharges a deposition material; a deposition source nozzle unit that is disposed at a side of the deposition source and includes a plurality of deposition source nozzles arranged in a first direction; a patterning slit sheet that is disposed opposite to the deposition source nozzle unit and includes a plurality of patterning slits arranged in a second direction perpendicular to the first direction; and a blocking member that is disposed between the substrate and the deposition source, wherein a deposition is performed while the substrate and the thin film deposition apparatus move relative to each other in the first direction, the deposition source, the deposition source nozzle unit, and the patterning slit sheet are formed integrally with each other, and when a deposition is performed, the blocking member moves along with the substrate to be positioned to screen at least one portion of the substrate.

According to a non-limiting aspect, the blocking member may screen a non-deposition region of the substrate.

According to a non-limiting aspect, the blocking member may screen edges of the substrate.

According to a non-limiting aspect, the blocking member may be positioned to move between the barrier plate assembly and the pattern slit sheet.

According to a non-limiting aspect, the blocking member may include a first blocking member that screens a first non-deposition region formed at a first end of the substrate and a second blocking member that screens a second non-deposition region formed at a second end of the substrate.

According to a non-limiting aspect, the first and second blocking members may have a flat plate shape.

According to a non-limiting aspect, the first and second blocking members may be moved along with the substrate such that the first blocking member is disposed to block deposition on the first non-deposition region, and the second blocking member may be disposed to block deposition on the second non-deposition region.

According to a non-limiting aspect, the first and second blocking members may be moved at the same speed as that of the substrate.

According to a non-limiting aspect, positions of the first and second blocking members with respect to the substrate may be constantly maintained.

According to a non-limiting aspect, the first and second blocking members may have a U-shaped cross-section.

According to a non-limiting aspect, one of the first and second blocking members may have a U-shaped cross-section, and the other of the first and second blocking members may have an L-shaped cross-section.

According to a non-limiting aspect, the first and second blocking members may be overlap with each other when deposition is not being performed on the substrate.

According to a non-limiting aspect, the first and second blocking members may be moved along with the substrate such that the first blocking member screens the first non-deposition region while the first blocking member is moved between the blocking plate assembly and the patterning slit sheet, and the second blocking member may screen the second non-deposition region while the second blocking member is moved between the blocking plate assembly and the patterning slit sheet.

According to a non-limiting aspect, the first blocking member may be moved at the same speed as that of the substrate while the first blocking member is moved between the barrier plate assembly and the patterning slit sheet, and the second blocking member may be moved at the same speed as that of the substrate while the second blocking member is moved between the barrier plate assembly and the patterning slit sheet.

According to a non-limiting aspect, a position of the first blocking member with respect to the substrate may be constantly maintained while the first blocking member is moved between the barrier plate assembly and the patterning slit sheet, and a position of the second blocking member with respect to the substrate may be constantly maintained while the second blocking member is moved between the barrier plate assembly and the patterning slit sheet.

According to a non-limiting aspect, the deposition source and the deposition source nozzle unit, and the patterning slit sheet may be connected to each other by a connection member.

According to a non-limiting aspect, the connection member may guide movement of the discharged deposition material.

According to a non-limiting aspect, the connection member may seal a space between the deposition source and the deposition source nozzle unit, and the patterning slit sheet.

According to a non-limiting aspect, the thin film deposition apparatus may be spaced apart from the substrate by a predetermined distance.

According to a non-limiting aspect, the deposition material discharged from the thin film deposition apparatus may be continuously deposited on the substrate while the substrate is moved relative to the thin film deposition apparatus in the first direction.

According to a non-limiting aspect, the patterning slit sheet of the thin film deposition apparatus may be smaller than the substrate.

According to a non-limiting aspect, the plurality of deposition source nozzles may be tilted at a predetermined angle.

According to a non-limiting aspect, the plurality of deposition source nozzles may include deposition source nozzles arranged in two rows arranged in the first direction, and the deposition source nozzles in each of the two rows may be tilted at the predetermined angle toward a corresponding deposition source nozzle of the other of the two rows.

According to a non-limiting aspect, the plurality of deposition source nozzles may include deposition source nozzles arranged in two rows formed in the first direction, the deposition source nozzles arranged in a row located at a first side of the patterning slit sheet may be arranged to face a second side of the patterning slit sheet, and the deposition source nozzles arranged in the other row located at the second side of the patterning slit sheet may be arranged to face the first side of the patterning slit sheet.

According to another aspect of the present invention, a thin film deposition apparatus that forms a thin film on a substrate includes a deposition source that discharges a deposition material; a patterning slit sheet that is disposed opposite to and spaced apart from the deposition source and comprises a plurality of patterning slits arranged in the first direction through which the deposition material travels to be deposited on the substrate; a blocking member that is positioned between the substrate and the deposition source to screen a non-deposition region of the substrate, wherein the substrate and the thin film deposition apparatus move relative to each other during a deposition process, and wherein when the substrate and the thin film deposition apparatus are moved relative to each other during the deposition process, the blocking member is moved between the deposition source and the patterning slit sheet to maintain a screening position with respect to the non-deposition region of the substrate.

According to one aspect of embodiments of the present invention, a method for forming a thin film on a substrate includes discharging a deposition material from a deposition source through a plurality of deposition source nozzles arranged in a first direction on a deposition source nozzle unit disposed at a side of the deposition source; passing the deposition material through a patterning slit sheet; and depositing the deposition material on the substrate, while moving the substrate and the patterning slit sheet relative to each other, wherein the patterning slit sheet is spaced apart from the substrate by a distance, and a blocking member is disposed between the substrate and the deposition source and is moved along with the substrate to be positioned to screen at least one portion of the substrate, and wherein the patterning slit sheet is disposed opposite to and spaced apart from the deposition source nozzle unit, and comprises a plurality of patterning slits arranged in the first direction.

According to another aspect of embodiments of the present invention, a method for forming a thin film on a substrate includes discharging a deposition material from a deposition source through a plurality of deposition source nozzles arranged in a first direction on a deposition source nozzle unit disposed at a side of the deposition source; passing the deposition material through a patterning slit sheet; and depositing the deposition material on the substrate, while moving the substrate and the patterning slit sheet relative to each other in the first direction, wherein a blocking member is disposed between the substrate and the deposition source and is moved along with the substrate to be positioned to screen at least one portion of the substrate; and the patterning slit sheet is disposed opposite to the deposition source nozzle unit and comprises a plurality of patterning slits arranged in a second direction perpendicular to the first direction.

According to a further aspect of embodiments of the present invention, a method for forming a thin film on a substrate includes discharging a deposition material from a deposition source; passing the deposition material through a plurality of patterning slits on a patterning slit sheet; and depositing the deposition material on the substrate, while moving the substrate and the patterning slit sheet relative to each other, wherein a blocking member is positioned between the substrate and the deposition source to screen a non-deposition region of the substrate and is moved along with the substrate to maintain a screening position with respect to the non-deposition region of the substrate, and wherein a patterning slit sheet is disposed to face and spaced apart from the deposition source, and the plurality of patterning slits is arranged in a first direction.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 7 is a schematic perspective view of a thin film deposition apparatus according to another embodiment of the present invention.

DETAILED DESCRIPTION OF THE EMBODIMENTS

Figure 1:
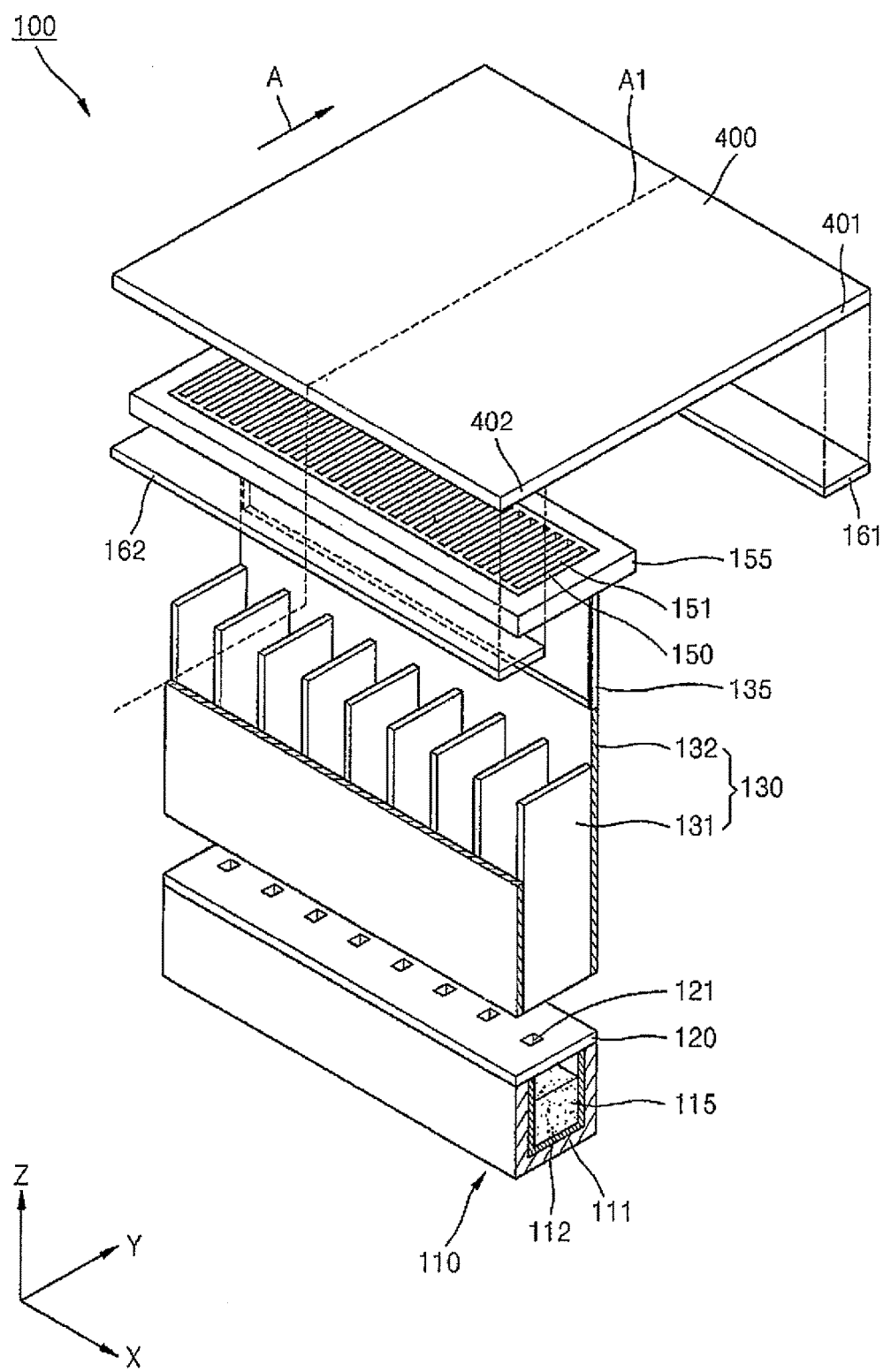
FIG. 1 is a schematic perspective view of a thin film deposition apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the aspects of the present invention by referring to the figures.

Figure 2:
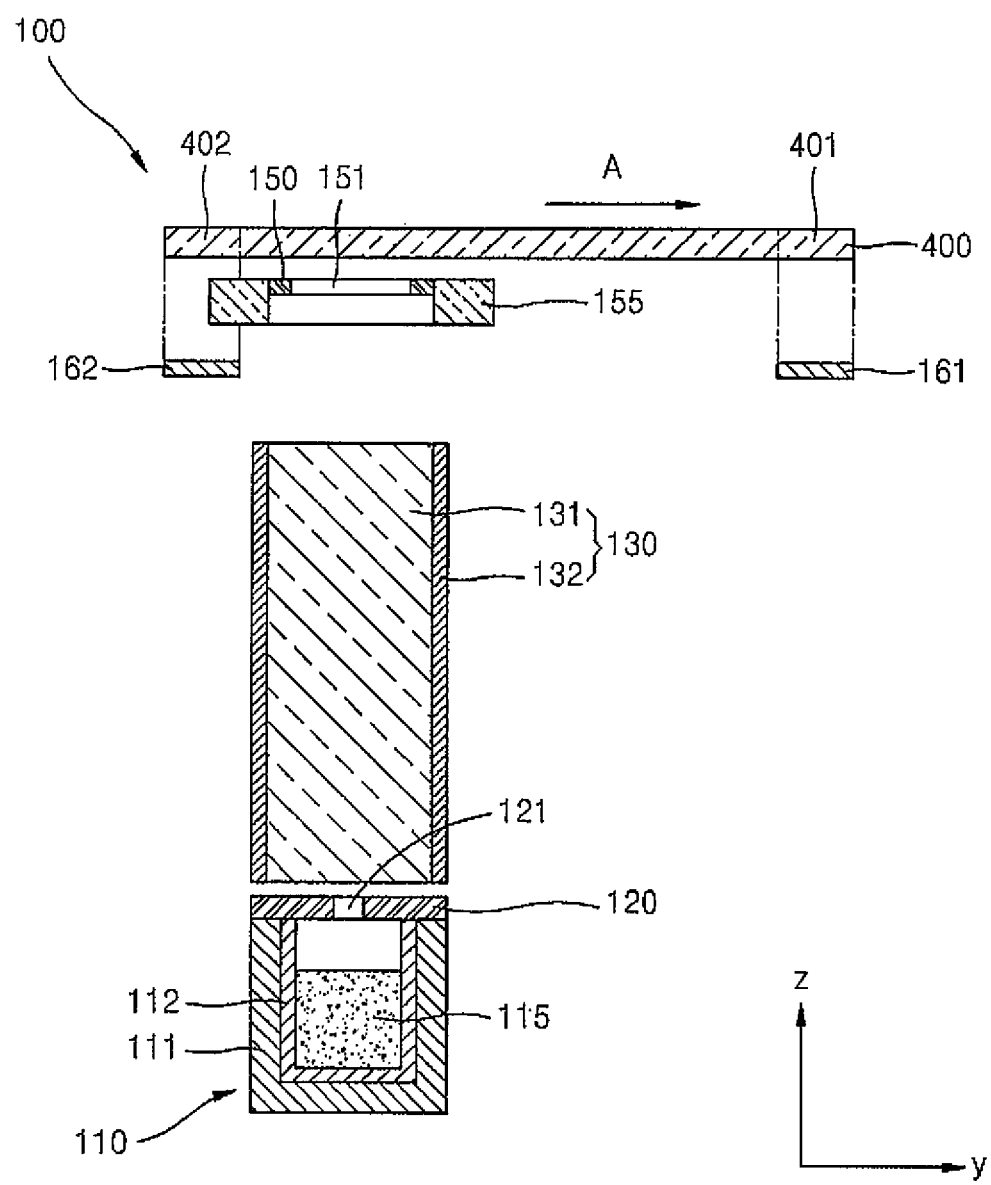
FIG. 2 is a schematic side view of the thin film deposition apparatus of FIG. 1.
Figure 3:
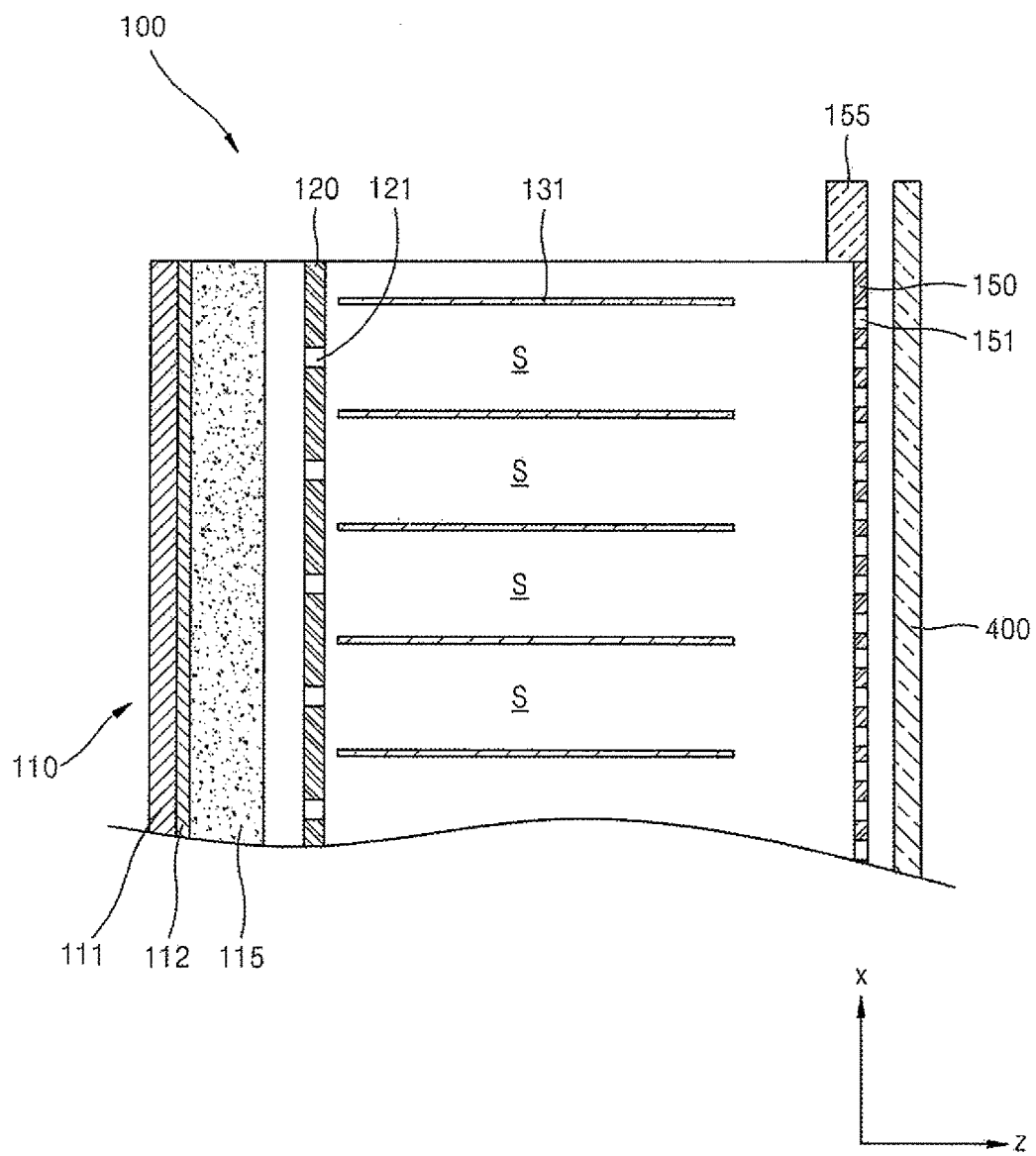
FIG. 3 is a schematic plan view of the thin film deposition apparatus of FIG. 1.

FIG. 1 is a schematic perspective view of a thin film deposition apparatus 100 according to an embodiment of the present invention, FIG. 2 is a schematic side view of the thin film deposition apparatus 100, and FIG. 3 is a schematic plan view of the thin film deposition apparatus 100.

Referring to FIGS. 1, 2 and 3, the thin film deposition apparatus 100 according to the current embodiment of the present invention includes a deposition source 110, a deposition source nozzle unit 120, a barrier plate assembly 130, a patterning slit sheet 150, and first and second blocking members 161 and 162.

Although a chamber is not illustrated in FIGS. 1, 2 and 3 for convenience of explanation, all the components of the thin film deposition apparatus 100 may be disposed within a chamber that is maintained at an appropriate degree of vacuum. The chamber is maintained at an appropriate vacuum in order to allow a deposition material to move in a straight direction.

In particular, in order to deposit a deposition material 115 that is emitted from the deposition source 110 and is discharged through the deposition source nozzle unit 120 and the patterning slit sheet 150, onto a substrate 400 in a desired pattern, it is desirable to maintain a chamber (not shown) in a high-vacuum state as in a deposition method using a fine metal mask (FMM). In addition, the temperatures of barrier plates 131 and the patterning slit sheet 150 may be sufficiently lower than the temperature of the deposition source 110. In this regard, the temperatures of the barrier plates 131 and the patterning slit sheet 150 may be about 100° C. or less, since the deposition material 115 that has collided against the barrier plates 131 does not become vaporized again when the temperature of the barrier plates 131 is sufficiently low. In addition, thermal expansion of the patterning slit sheet 150 may be minimized when the temperature of the patterning slit sheet 150 is sufficiently low. The barrier plate assembly 130 faces the deposition source 110 which is at a high temperature. In addition, the temperature of a portion of the barrier plate assembly 130 close to the deposition source 110 may rise by a maximum of about 167° C., and thus a partial-cooling apparatus may be further included if needed. To this end, the barrier plate assembly 130 may include a cooling member.

The substrate 400, which constitutes a deposition target on which a deposition material 115 is to be deposited, is disposed in the chamber. The substrate 400 may be a substrate for flat panel displays. A large substrate, such as a mother glass, for manufacturing a plurality of flat panel displays, may be used as the substrate 400. Other substrates may also be employed.

In the current embodiment of the present invention, deposition may be performed while the substrate 400 or the thin film deposition apparatus 100 is moved relative to each other. Herein, where it is stated that the substrate and thin film deposition assembly are moved relative to each other, it is to be understood that such statement encompasses an embodiment in which only the substrate is moved and the thin film deposition assembly remains stationary, an embodiment in which only the thin film deposition assembly is moved and the substrate remains stationary and an embodiment in which both the thin film deposition assembly and the substrate are moved.

In particular, in the conventional FMM deposition method, the size of the FMM is typically greater than or equal to the size of a substrate. Thus, the size of the FMM has to be increased when performing deposition on a larger substrate. However, it is difficult to manufacture a large FMM and to extend an FMM to be accurately aligned with a pattern.

In order to overcome this problem, in the thin film deposition apparatus 100 according to the current embodiment of the present invention, deposition may be performed while the thin film deposition apparatus 100 and the substrate 400 are moved relative to each other. In other words, deposition may be continuously performed while the substrate 400, which is disposed such as to face the thin film deposition apparatus 100, is moved in a Y-axis direction. That is, deposition is performed in a scanning manner while the substrate 400 is moved in a direction of arrow A in FIG. 1. Although the substrate 400 is illustrated as being moved in the Y-axis direction in FIG. 3 when deposition is performed, the present invention is not limited thereto. Deposition may be performed while the thin film deposition apparatus 100 is moved in the Y-axis direction, while the substrate 400 is held in a fixed position.

Thus, in the thin film deposition apparatus 100 according to the current embodiment of the present invention, the patterning slit sheet 150 may be significantly smaller than an FMM used in a conventional deposition method. In other words, in the thin film deposition apparatus 100 according to the current embodiment of the present invention, deposition is continuously performed, i.e., in a scanning manner, while the substrate 400 is moved in the Y-axis direction. Thus, lengths of the patterning slit sheet 150 in the X-axis and Y-axis directions may be significantly less than the lengths of the substrate 400 in the X-axis and Y-axis directions. As described above, since the patterning slit sheet 150 may be formed to be significantly smaller than an FMM used in a conventional deposition method, it is relatively easy to manufacture the patterning slit sheet 150 used in embodiments of the present invention. In other words, using the patterning slit sheet 150, which is smaller than an FMM used in a conventional deposition method, is more convenient in all processes, including etching and subsequent other processes, such as precise extension, welding, moving, and cleaning processes, compared to the conventional deposition method using the larger FMM. This is more advantageous for manufacturing a relatively large display device.

In order to perform deposition while the thin film deposition apparatus 100 and the substrate 400 are moved relative to each other as described above, the thin film deposition apparatus 100 and the substrate 400 may be separated from each other by a predetermined distance. This will be described later in detail.

The deposition source 110 that contains and heats the deposition material 115 is disposed in the chamber at a side of the thin film deposition assembly 100 that is opposite to and spaced apart from the substrate 400. As the deposition material 115 contained in the deposition source 110 is vaporized, the deposition material 115 is deposited on the substrate 400.

In particular, the deposition source 110 includes a crucible 111 that is filled with the deposition material 115, and a heater 112 that heats the crucible 111 to vaporize the deposition material 115, which is contained in the crucible 111. The vaporized deposition material 115 travels from the crucible 111 towards the deposition source nozzle unit 120.

The deposition source nozzle unit 120 is disposed at a side of the deposition source 110, and in particular, at the side of the deposition source 110 facing the substrate 400. The deposition source nozzle unit 120 includes a plurality of deposition source nozzles 121 arranged at equal intervals in the X-axis direction. The deposition material 115 that is vaporized in the deposition source 110, passes through the deposition source nozzle unit 120 towards the substrate 400.

The barrier plate assembly 130 is disposed at a side of the deposition source nozzle unit 120. The barrier plate assembly 130 includes a plurality of barrier plates 131, and a barrier plate frame 132 that covers sides of the barrier plates 131. The plurality of barrier plates 131 may be arranged parallel to each other at equal intervals in X-axis direction. In addition, each of the barrier plates 131 may be arranged parallel to an YZ plane in FIG. 3, i.e., perpendicular to X-axis direction. The plurality of barrier plates 131 arranged as described above partition the space between the deposition source nozzle unit 120 and the patterning slit sheet 150 into a plurality of sub-deposition spaces S. In the thin film deposition apparatus 100 according to the current embodiment of the present invention, the deposition space is divided by the barrier plates 131 into the sub-deposition spaces S that respectively correspond to the deposition source nozzles 121 through which the deposition material 115 is discharged, as shown in FIG. 3.

The barrier plates 131 may be respectively disposed between adjacent deposition source nozzles 121. In other words, each of the deposition source nozzles 121 may be disposed between two adjacent barrier plates 131. The deposition source nozzles 121 may be respectively located at the midpoint between two adjacent barrier plates 131. As described above, since the barrier plates 131 partition the space between the deposition source nozzle unit 120 and the patterning slit sheet 150 into the plurality of sub-deposition spaces S, the deposition material 115 discharged through each of the deposition source nozzles 121 is not mixed with the deposition material 115 discharged through the other deposition source nozzles slits 121, and passes through patterning slits 151 so as to be deposited on the substrate 400. In other words, the barrier plates 131 guide the deposition material 115, which is discharged through the deposition source nozzles 121, to move straight, not to flow in the (X-axis direction).

As described above, the deposition material 115 is forced to move straight by the presence of the barrier plates 131, so that a smaller shadow zone may be formed on the substrate 400 compared to a case where no barrier plates are installed. Thus, the thin film deposition apparatus 100 and the substrate 400 can be separated from each other by a predetermined distance. This will be described later in detail.

The barrier plate frame 132, which forms upper and lower sides of the barrier plates 131, maintains the positions of the barrier plates 131, and guides the deposition material 115, which is discharged through the deposition source nozzles 121, not to flow beyond the boundaries of the barrier wall assembly 130 in the Y-axis direction.

Although the deposition source nozzle unit 120 and the barrier plate assembly 130 are illustrated as being separated from each other by a predetermined distance, the present invention is not limited thereto. In order to prevent the heat emitted from the deposition source 110 from being conducted to the barrier plate assembly 130, the deposition source nozzle unit 120 and the barrier plate assembly 130 may be spaced apart from each other by a predetermined distance. Alternatively, if a heat insulator is disposed between the deposition source nozzle unit 120 and the barrier plate assembly 130, the deposition source nozzle unit 120 and the barrier plate assembly 130 may be joined together with the heat insulator therebetween.

In addition, the barrier plate assembly 130 may be constructed to be detachable from the thin film deposition apparatus 100. A conventional FMM deposition method has low deposition efficiency. Herein, deposition efficiency refers to the ratio of the amount of deposition material deposited on a substrate to the amount of deposition material vaporized from a deposition source. The conventional FMM deposition method has a deposition efficiency of about 32%. Furthermore, in the conventional FMM deposition method, about 68% of organic deposition material, which has not been deposited on the substrate, remains adhered to a deposition apparatus, and thus it is difficult to reuse the deposition material.

In order to overcome these problems, in the thin film deposition apparatus 100 according to the current embodiment of the present invention, the deposition space is enclosed by using the barrier plate assembly 130, so that the vaporized deposition material 115 that is not deposited on the substrate 400 is mostly deposited within the barrier plate assembly 130. Thus, since the barrier plate assembly 130 is constructed to be detachable from the thin film deposition apparatus 100, when a large amount of the deposition material 115 is present on the barrier plate assembly 130 after a long deposition process, the barrier plate assembly 130 may be detached from the thin film deposition apparatus 100 and then placed in a separate deposition material recycling apparatus in order to recover the deposition material 115. Due to the structure of the thin film deposition apparatus 100 according to the present embodiment, a reuse rate of the deposition material 115 is increased, so that the deposition efficiency is improved, and thus, the manufacturing costs are reduced.

The patterning slit sheet 150 and a frame 155 in which the patterning slit sheet 150 is bound are disposed between the deposition source 110 and the substrate 400. The frame 155 may be formed in a lattice shape, similar to a window frame. The patterning slit sheet 150 is bound inside the frame 155. The patterning slit sheet 150 includes a plurality of patterning slits 151 arranged in the X-axis direction. The deposition material 115 that is vaporized in the deposition source 110, passes through the deposition source nozzle unit 120 and the patterning slit sheet 150 towards the substrate 400. The patterning slit sheet 150 may be manufactured by etching, which is the same method as used in a conventional method of manufacturing an FMM, and in particular, a striped FMM.

In the thin film deposition apparatus 100 according to the current embodiment of the present invention, the total number of patterning slits 151 may be greater than the total number of deposition source nozzles 121. In addition, there may be a greater number of patterning slits 151 than deposition source nozzles 121 disposed between two adjacent barrier plates 131.

In other words, at least one deposition source nozzle 121 may be disposed between each two adjacent barrier plates 131. Meanwhile, a plurality of patterning slits 151 may be disposed between each two adjacent barrier plates 131. The space between the deposition source nozzle unit 120 and the patterning slit sheet 150 is partitioned by the barrier plates 131 into sub-deposition spaces S that correspond to the deposition source nozzles 121, respectively. Thus, the deposition material 115 discharged from each of the deposition source nozzles 121 passes through a plurality of patterning slits 151 disposed in the sub-deposition space S corresponding to the deposition source nozzle 121, and is then deposited on the substrate 400.

The first and second blocking members 161 and 162 are disposed between the barrier plate assembly 130 and the patterning slit sheet 150. In the thin film deposition apparatus according to the current embodiment of the present invention, the first and second blocking members 161 and 162 are disposed to move along with the substrate 400 and screen first and second non-deposition regions 401 and 402 of the substrate 400 so that an deposition material 115 is prevented from being deposited on the first and second non-deposition regions 401 and 402 of the substrate 400. This will be described later in detail with reference to FIGS. 5A to 5D.

The barrier plate assembly 130 and the patterning slit sheet 150 may be formed to be spaced apart from each other by a predetermined distance. Alternatively, the barrier plate assembly 130 and the patterning slit sheet 150 may be connected by a connection member 135. The temperature of the barrier plate assembly 130 may increase to 100° C. or higher due to exposure to the deposition source 110, which has a high temperature. Thus, in order to prevent the heat of the barrier plate assembly 130 from being conducted to the patterning slit sheet 150, the barrier plate assembly 130 and the patterning slit sheet 150 may be spaced apart from each other by a predetermined distance.

As described above, the thin film deposition apparatus 100 according to the current embodiment of the present invention performs deposition while being moved relative to the substrate 400. In order for the thin film deposition apparatus 100 to be movable relative to the substrate 400, the patterning slit sheet 150 is spaced apart from the substrate 400 by a predetermined distance. In addition, in order to prevent the formation of a relatively large shadow zone on the substrate 400 when the patterning slit sheet 150 and the substrate 400 are separated from each other, the barrier plates 131 are arranged between the deposition source nozzle unit 120 and the patterning slit sheet 150 to force the deposition material 115 to move in a straight direction. Thus, the size of the shadow zone formed on the substrate 400 is sharply reduced.

In particular, in a conventional deposition method using an FMM, deposition is performed with the FMM in close contact with a substrate in order to prevent formation of a shadow zone on the substrate. However, when the FMM is used in close contact with the substrate, the contact may cause defects. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In order to overcome this and/or other problems, in the thin film deposition apparatus 100 according to the current embodiment of the present invention, the patterning slit sheet 150 is disposed to be separated from the substrate 400 by a predetermined distance. Shadow zones on the substrate 400 are minimized by installing the barrier plates 131.

As described above, according to aspects of the present invention, a mask is formed to be smaller than a substrate, and deposition is performed while the mask is moved relative to the substrate. Thus, the mask can be easily manufactured. In addition, defects caused due to the contact between a substrate and an FMM, which occurs in the conventional deposition method, may be prevented. Furthermore, since it is unnecessary to use the FMM in close contact with the substrate during a deposition process, the manufacturing speed may be improved.

Hereinafter, the size of a shadow zone formed on a substrate when barrier plates are installed and the size of a shadow zone formed on a substrate when no barrier plates are installed are compared.

Figure 4A:
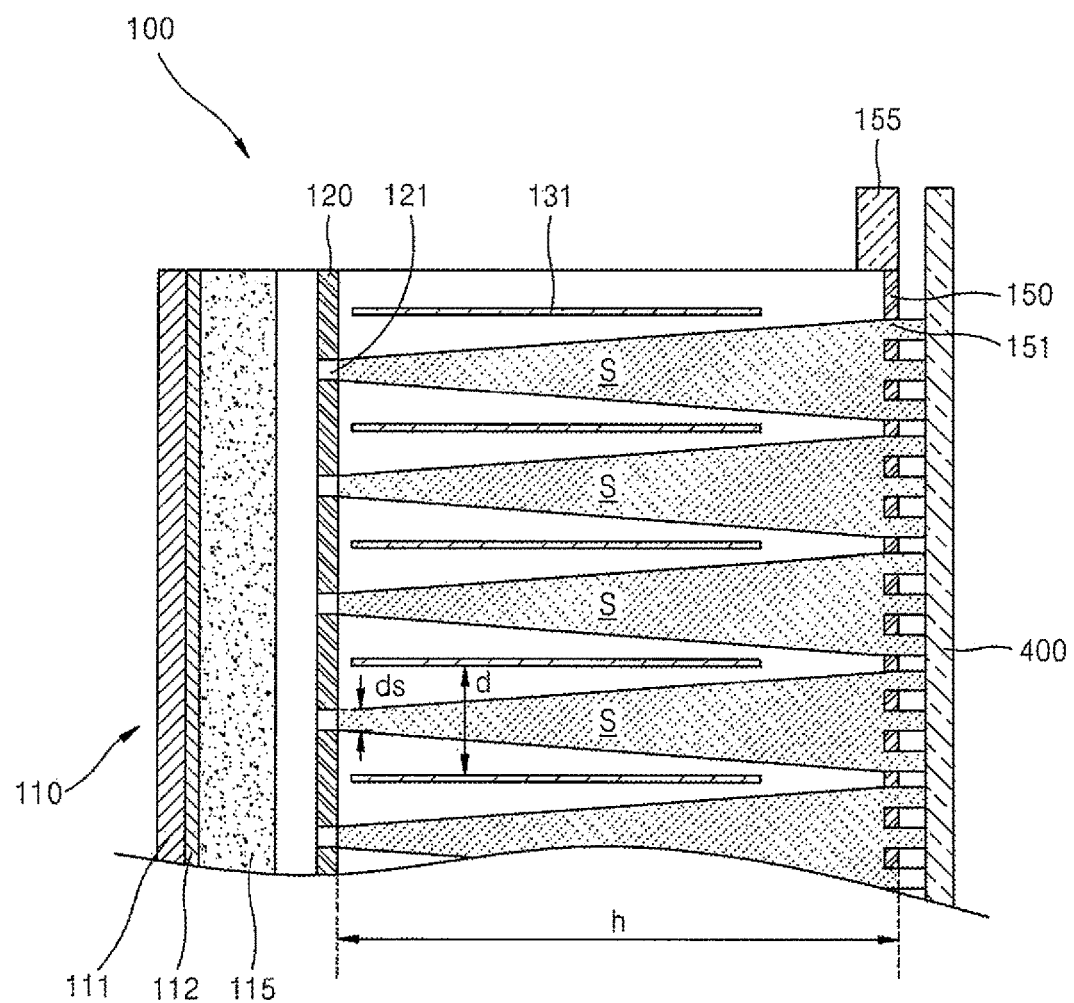
FIG. 4A is a schematic view illustrating deposition of a deposition material in the thin film deposition apparatus of FIG. 1.
Figure 4B:
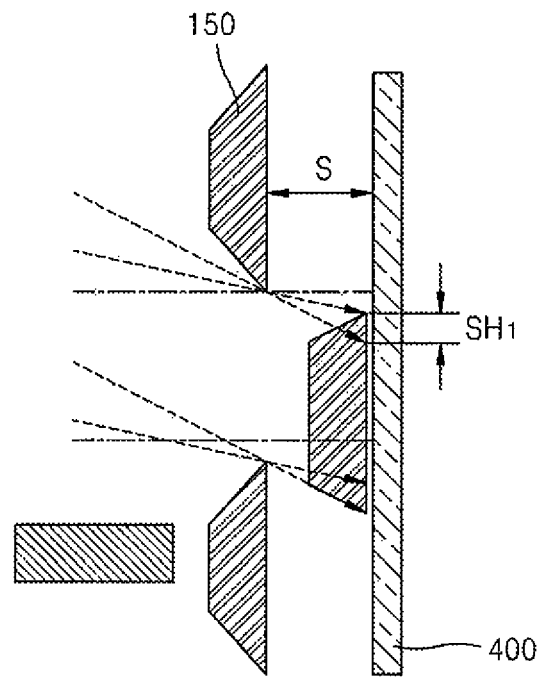
FIG. 4B illustrates a shadow zone of a thin film deposited on a substrate when a deposition space is partitioned by barrier plates, as illustrated in FIG. 4A.
Figure 4C:
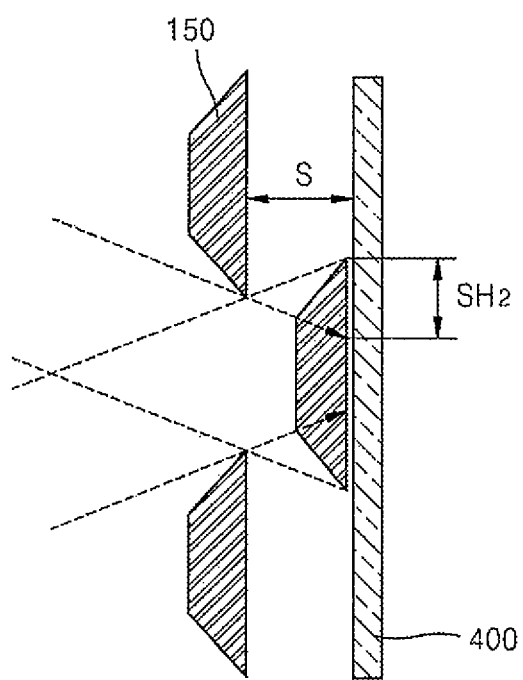
FIG. 4C illustrates a shadow zone of a thin film deposited on the substrate when the deposition space is not partitioned.

FIG. 4A is a schematic view illustrating deposition of a deposition material in the thin film deposition apparatus of FIG. 1. FIG. 4B illustrates a shadow zone of a thin film deposited on a substrate when a deposition space is partitioned by barrier plates, as illustrated in FIG. 4A. FIG. 4C illustrates a shadow zone of a thin film deposited on the substrate when the deposition space is not partitioned.

Referring to FIG. 4A, the deposition material 115 that is vaporized in the deposition source 110 is deposited on the substrate 400 by being discharged through the deposition source nozzle unit 120 and the patterning slit sheet 150. Since the space between the deposition source nozzle unit 120 and the patterning slit sheet 150 is partitioned into a plurality of sub-deposition spaces S by the barrier plates 131, the deposition material 115 discharged through each of the deposition source nozzles 121 is not mixed with the deposition material 115 discharged through the other adjacent deposition source nozzles 121 due to the barrier plates 131.

When the space between the deposition source nozzle unit 120 and the patterning slit sheet 150 is partitioned by the barrier plate assembly 130, as illustrated in FIGS. 4A and 4B, a width $SH_1$ of a shadow zone formed on the substrate 400 may be determined using Equation 1 below.

$$SH_1 = s * d_s / h \quad \text{(Equation 1)}$$

where s denotes a distance between the patterning slit sheet 150 and the substrate 400, $d_s$ denotes a width of each of the deposition source nozzles 121, and h denotes a distance between the deposition source 110 and the patterning slit sheet 150.

However, when the space between the deposition source nozzle unit 120 and the patterning slit sheet 150 is not partitioned by the barrier plates 131, as illustrated in FIG. 4C, the deposition material 115 is discharged through the patterning slit sheet 150 in a wider range of angles than in the case of FIG. 4B. This is because the deposition material 115 discharged not just through a deposition source nozzle 121 directly facing a patterning slit 151 but also through deposition source nozzles 121 other than the deposition source nozzle 121 above, passes through the patterning slit 151 above and is then deposited on the substrate 400. Thus, a width $SH_2$ of a shadow zone formed on the substrate 400 is much greater than when the deposition space is partitioned by the barrier plates 131. The width $SH_2$ of the shadow zone formed on the substrate 400 is determined using Equation 2.

$$SH_2 = s*2d/h \qquad \text{(Equation 2)}$$

where s denotes a distance between the patterning slit sheet 150 and the substrate 400, d denotes an interval between adjacent barrier plates 131, and h denotes a distance between the deposition source 110 and the patterning slit sheet 150.

Referring to Equations 1 and 2, $d_s$, which is the width of each of the deposition source nozzles 121, is a few to tens times less than d, which is the interval between the adjacent barrier plates 131, and thus the shadow zone may have a smaller width when the space between the deposition source nozzle unit 120 and the patterning slit sheet 150 is partitioned by the barrier plates 131. The width $SH_2$ of the shadow zone formed on the substrate 400 may be reduced by either one of the following: (1) by reducing the interval d between the adjacent barrier plates 131, (2) by reducing the distance s between the patterning slit sheet 150 and the substrate 400, or (3) by increasing the distance h between the deposition source 110 and the patterning slit sheet 150.

As described above, the shadow zone formed on the substrate 400 may be reduced by installing the barrier plates 131. Thus, the patterning slit sheet 150 can be spaced apart from the substrate 400.

It is to be understood that the thin film deposition apparatus 100 may vary from what is described above.

Hereinafter, a method of performing thin film deposition using the first and second blocking members 161 and 162 of the thin film deposition apparatus 100, according to the current embodiment of the present invention, will be described in detail.

FIGS. 5A to 5D are schematic views illustrating a method of manufacturing an organic light-emitting display device using a thin film deposition apparatus 100 of FIG. 1.

Referring to FIGS. 5A to 5D, the first and second blocking members 161 and 162 of the thin film deposition apparatus 100 according to the current embodiment of the present invention are disposed at edges of the substrate 400 so that the organic material is prevented from being deposited on the first and second non-deposition regions 401 and 402 of the substrate 400.

Specifically, an anode electrode pattern or a cathode electrode pattern is formed on the edges of the substrate 400, wherein the anode electrode pattern or cathode electrode pattern is used as a terminal for product testing or manufacturing. If the organic material is deposited on the first and second non-deposition regions 401 and 402, the anode electrode or the cathode electrode may not function properly. Thus, it is desirable to avoid deposition of organic material on the first and second non-deposition regions 401 and 402. As described above, however, since deposition is performed using a scanning method while the substrate 400 is moved relative to the thin film deposition apparatus 100 according to the current embodiment of the present invention, it is not easy to prevent the organic material from being deposited on the first and second non-deposition regions 401 and 402 of the substrate 400.

As such, in order to prevent the deposition of the organic material on the first and second non-deposition regions 401 and 402 of the substrate 400, the thin film deposition apparatus 100 according to the current embodiment of the present invention includes the first and second blocking members 161 and 162 disposed at the edges of the substrate 400.

Figure 5A:
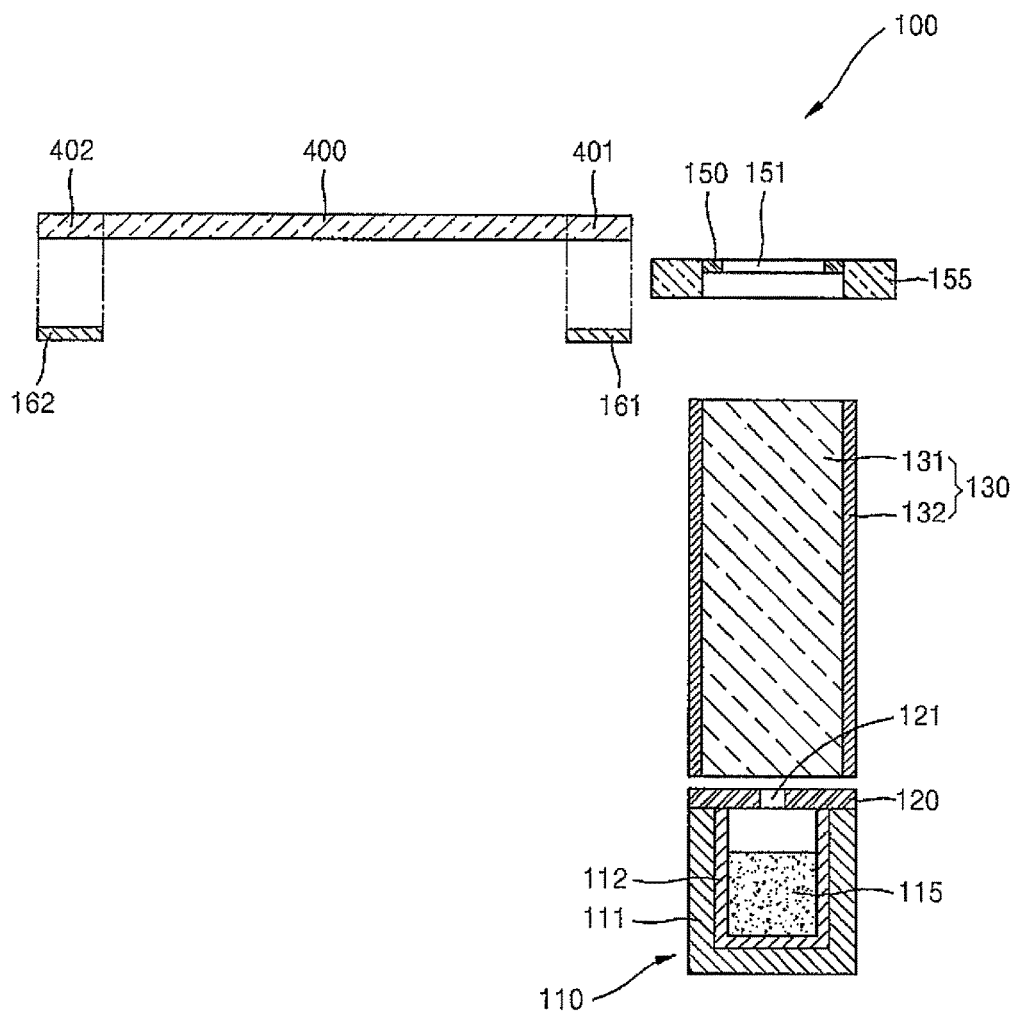
FIGS. 5A to 5D are schematic views illustrating a method of manufacturing an organic light-emitting display device using the thin film deposition apparatus of FIG. 1.

Referring to FIG. 5A, the first and second blocking members 161 and 162 are disposed space apart from the substrate 400, in particular, spaced apart from the surface of the substrate 400 facing the deposition source 110. In this regard, the first blocking member 161 is disposed in a blocking position relative to the first non-deposition region 401 of the substrate 400, and the second blocking member 162 is disposed in a blocking position relative to the second non-deposition region 402 of the substrate 400. The first blocking member 161 and the second blocking member 162 may be in the form of flat plates.

As described above, deposition may be continuously performed while the substrate 400, which is disposed such as to face the thin film deposition apparatus 100, is moved in the Y-axis direction. In other words, deposition is performed in a scanning manner while the substrate 400 is moved in a direction of an arrow A in FIG. 5B. The first blocking member 161 and the second blocking member 162 are moved in the direction of the arrow A at the same speed as that of the substrate 400. That is, the relative positions of the first and second blocking members 161 and 162 to the substrate 400 are fixed. The first blocking member 161 is disposed in a blocking position relative to the first non-deposition region 401 of the substrate 400, and the second blocking member 162 is disposed in a blocking position relative to the second non-deposition region 402 of the substrate 400.

Figure 5B:
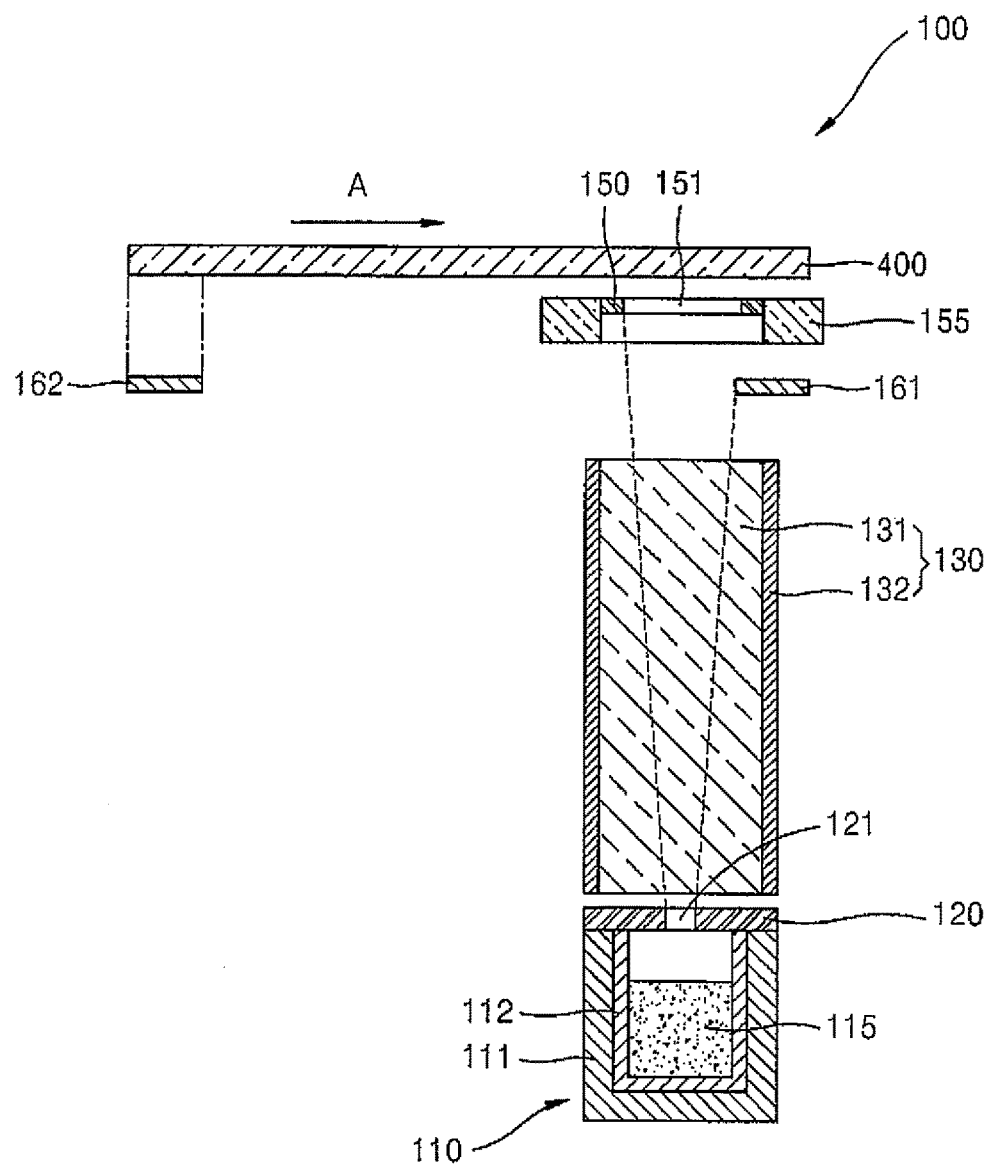

As shown in FIGS. 5A and 5B, when the first non-deposition region 401 of the substrate 400 is positioned to face the deposition source 110 after the substrate 400 is moved by a predetermined distance in the direction of the arrow A, the first blocking member 161 is disposed between the barrier plate assembly 130 and the patterning slit sheet 150 to prevent the deposition material 115 that is vaporized in the deposition source 110 from being deposited on the first non-deposition region 401.

Figure 5C:
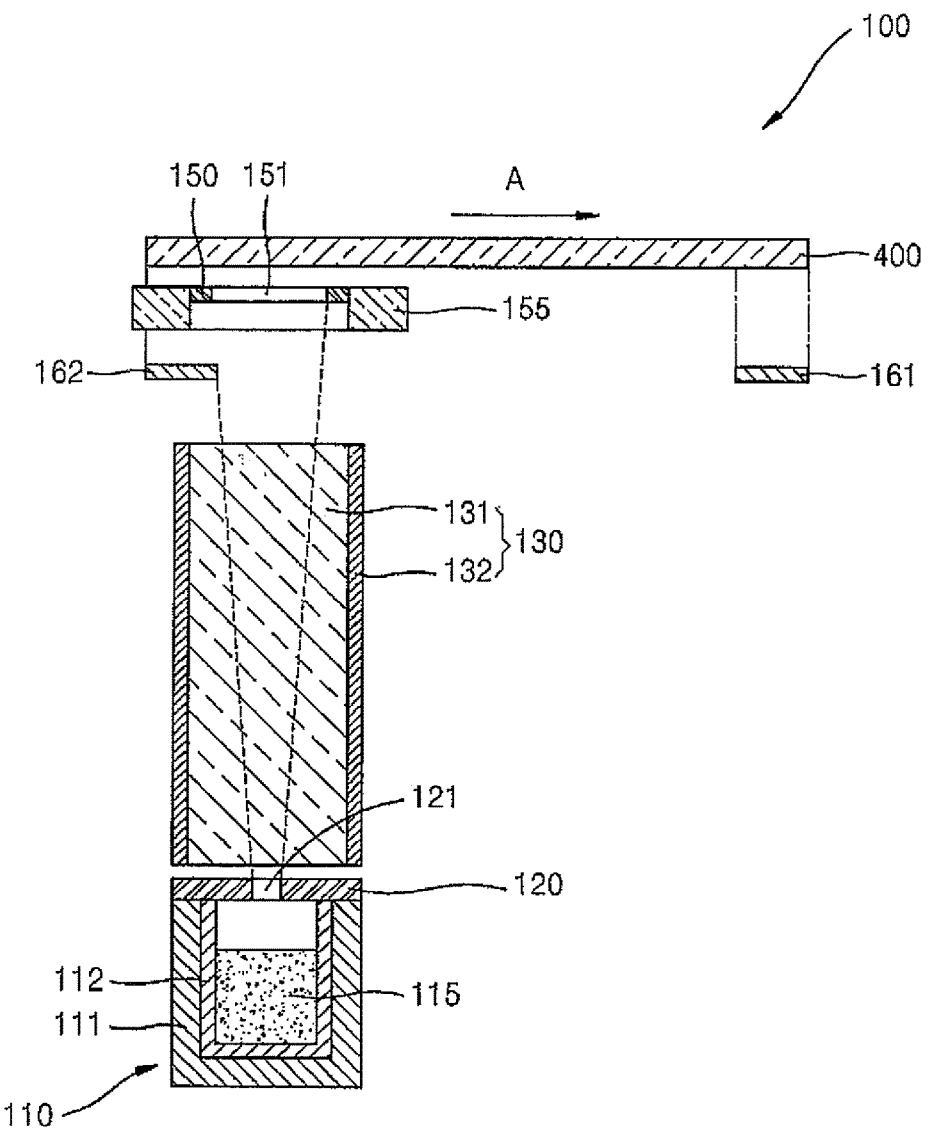

In addition, as shown in FIG. 5C, when the second non-deposition region 402 of the substrate 400 is positioned to face the deposition source 110 after the substrate 400 is further moved in the direction of the arrow A, the second blocking member 162 is disposed between the barrier plate assembly 130 and the patterning slit sheet 150 to prevent the deposition material 115 that is vaporized in the deposition source 110 from being deposited on the second non-deposition region 402.

Since the first and second blocking members 161 and 162 screen the first and second non-deposition regions 401 and 402 of the substrate 400, the organic material may be prevented from being deposited on the first and second non-deposition regions 401 and 402 of the substrate 400 without the necessity of providing another structure.

Figure 5D:
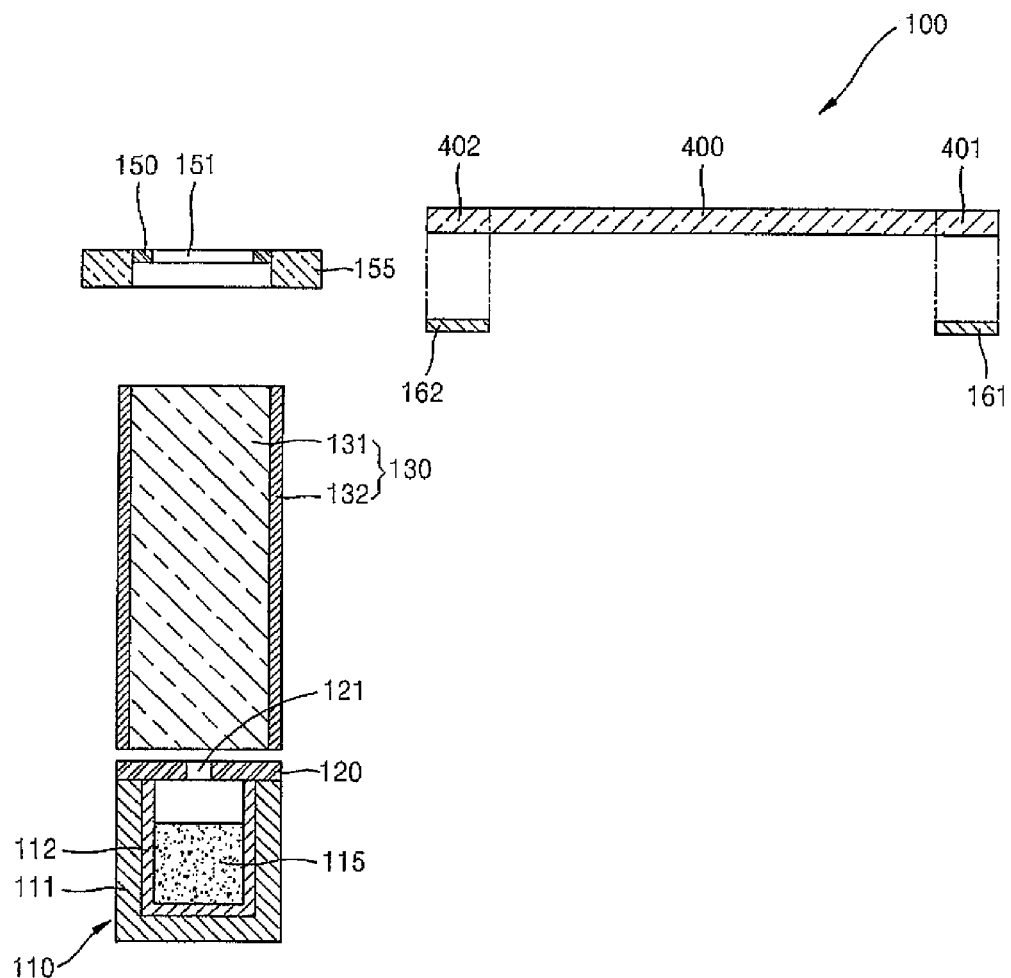

As shown in FIG. 5D, according to the present embodiment, the first blocking member 161 and the second blocking member 162 maintain a fixed position relative to the substrate 400 after the substrate 400 and the thin film deposition apparatus 100 have moved beyond each other. Moreover, in a chamber that has a plurality of thin film deposition apparatuses, the first and second blocking members 161 and 162 continue to block the first and second non-deposition regions 401 and 402 for subsequent deposition procedures.

Hereinafter, a method of performing thin film deposition using first and second blocking members 161 and 162 of a thin film deposition apparatus 100 according to a modification of the current embodiment will be described in detail.

FIGS. 6A to 6D are schematic views illustrating a method of manufacturing an organic light-emitting display device using a thin film deposition apparatus 100 according to the modification of the current embodiment.

Referring to FIGS. 6A to 6D, the first and second blocking members 161 and 162 of the thin film deposition apparatus 100 according to modification of the current embodiment are disposed at edges of the substrate 400 so that the organic material is prevented from being deposited on first and second non-deposition regions 401 and 402 of the substrate 400. In this the embodiment of FIGS. 6A to 6D, the first and second blocking members 161 and 162 are not maintained in a fixed position relative to the substrate at all time during a deposition process. Specifically, the first blocking member 161 and the second blocking member 162 may be moved independently of each other, and the first blocking member 161 and the second blocking member 162 may be moved independently from the substrate. This will now be described in detail below.

Since the space in a chamber (not shown) in which the thin film deposition apparatus 100 is disposed is limited, it is desirable that the space taken up by the first and second blocking members 161 and 162 be minimized to improve space utilization. In this regard, if the position of the first blocking member 161 that screens the first non-deposition region 401 of the substrate 400 relative to the substrate 400 and the position of the second blocking member 162 that screens the second non-deposition region 402 of the substrate 400 relative to the substrate 400 are fixed, the space occupied by the first and second blocking members 161 and 162 increases in the chamber.

Figure 6A:
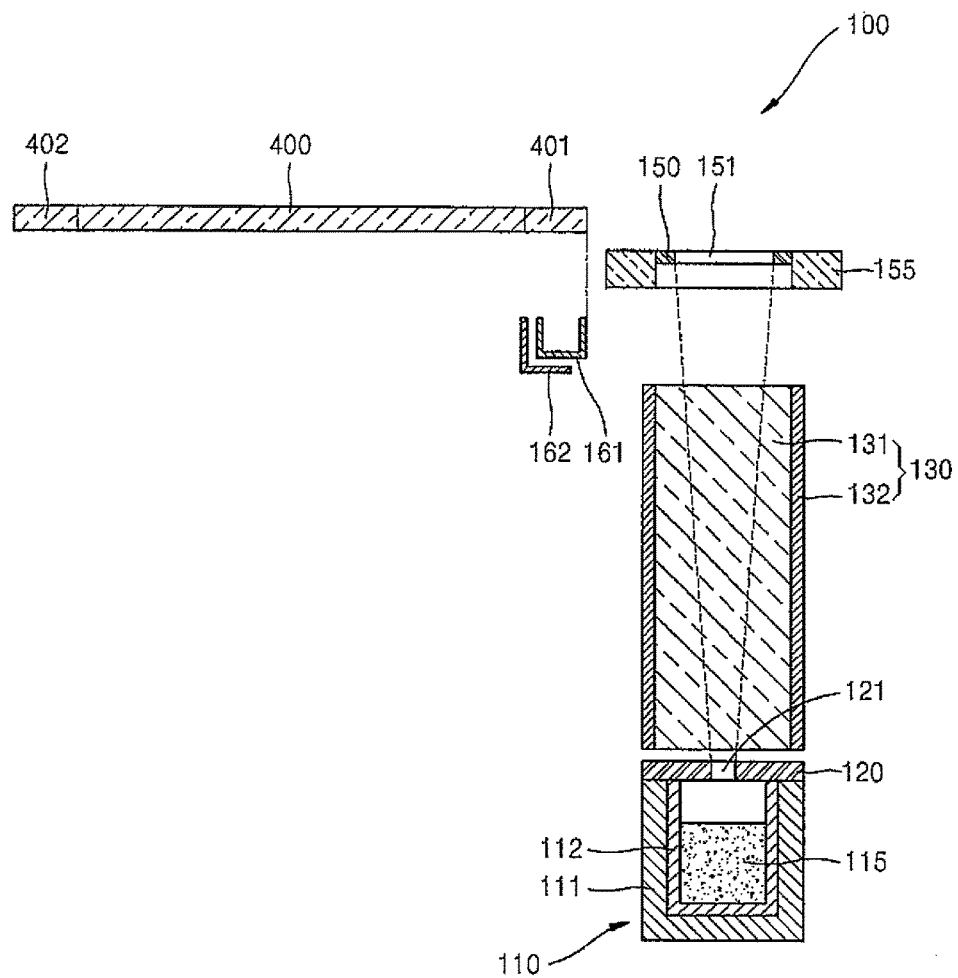
FIGS. 6A to 6D are schematic views illustrating a method of manufacturing an organic light-emitting display device using a thin film deposition apparatus according to modification of the current embodiment.
Figure 6B:
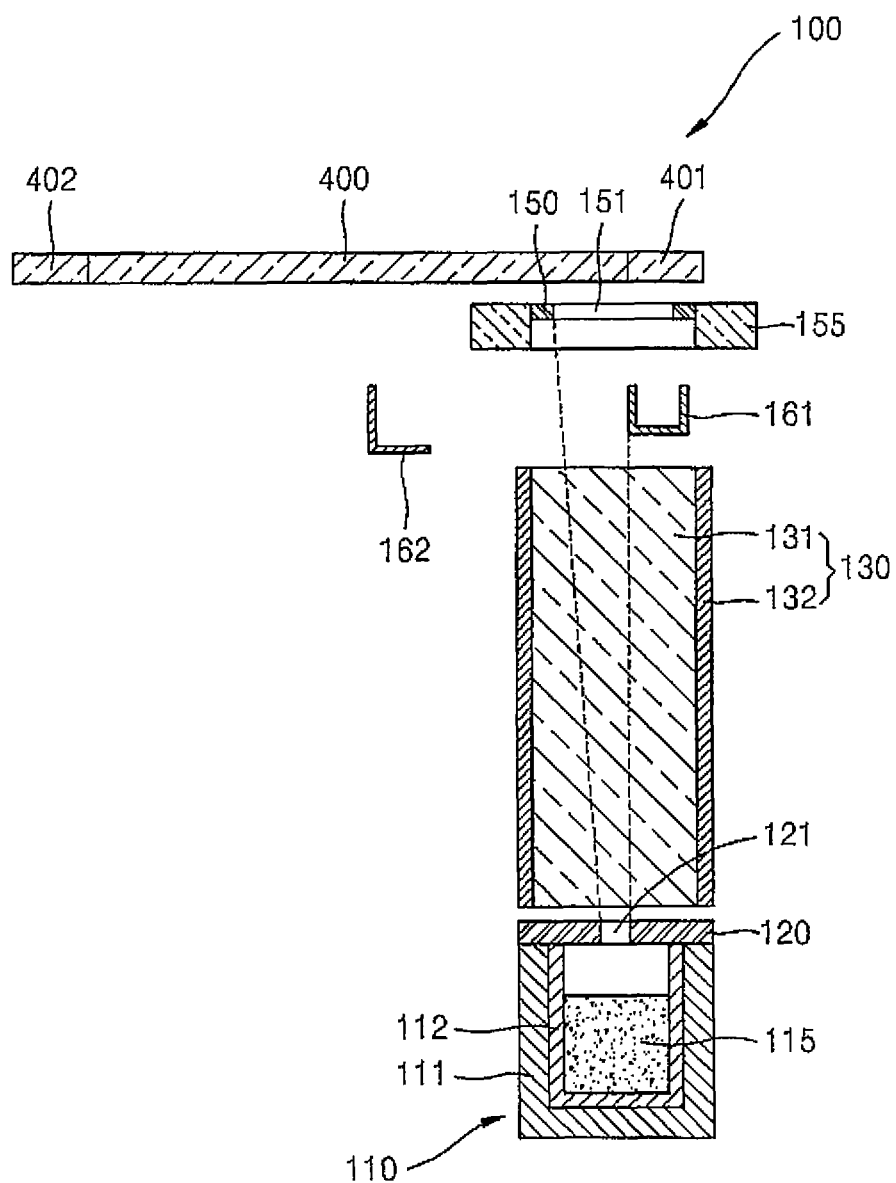
Figure 6C:
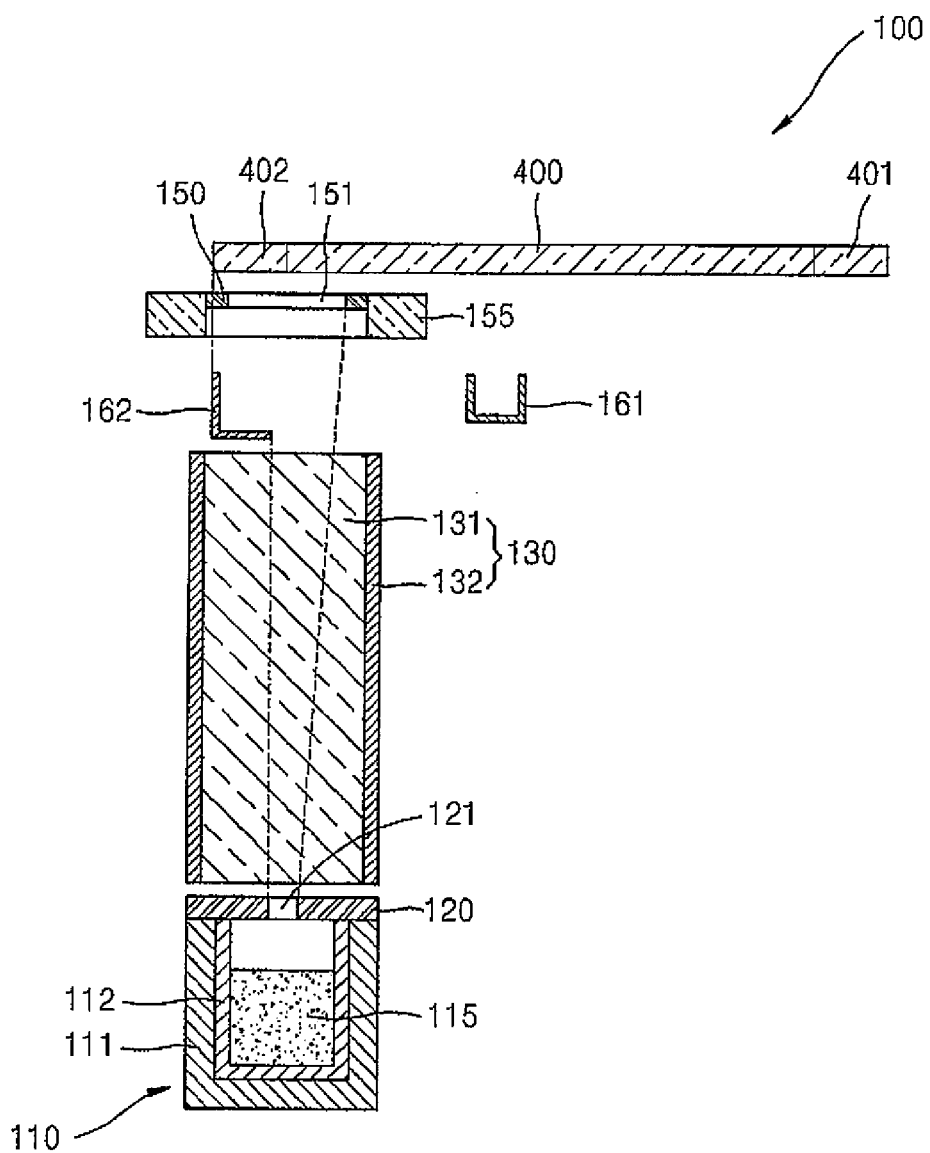
Figure 6D:
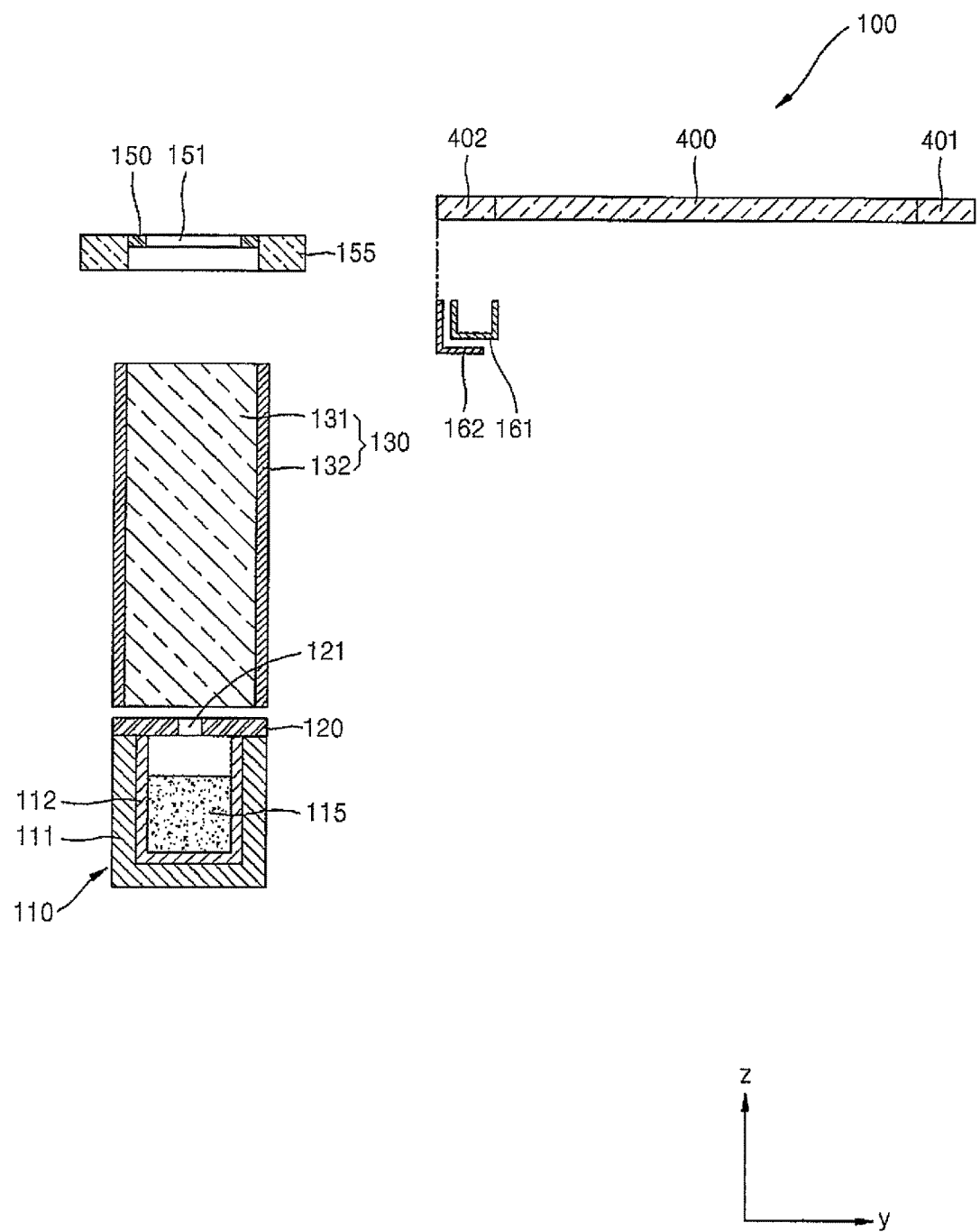

Thus, in order to minimize the space occupied by the first and second blocking members 161 and 162 in the chamber, as shown in FIGS. 6A and 6D, the first blocking member 161 and the second blocking member 162 are maintained in an overlapping position when deposition is not being performed on the substrate 400. That is, the first and second blocking members 161 and 162 are disposed to overlap each other adjacent to the surface of the substrate 400 facing the deposition source 110.

As shown in FIG. 6B, the first blocking member 161 is moved along the first non-deposition region 401 of the substrate 400 at the same speed as that of the substrate 400 while the first non-deposition region 401 of the substrate 400 passes over the deposition source 110 so as to prevent the deposition material 115 that is vaporized in the deposition source 110 from being deposited on the first non-deposition region 401. That is, when the substrate 400 and the deposition source 110 are positioned such that deposition is performed in an area of the substrate where the first non-deposition region 401 is located, the first blocking member 161 is maintained in a fixed position relative to the first non-deposition region 401. The second blocking member 162 is moved so as to not be positioned between the deposition source 110 and the substrate 400. As shown in FIG. 6C, the second blocking member 162 is moved along the second non-deposition region 402 of the substrate 400 at the same speed as that of the substrate 400 while the second non-deposition region 402 of the substrate 400 passes over the deposition source 110 so as to prevent the deposition material 115 that is vaporized in the deposition source 110 from being deposited on the second non-deposition region 402. That is, when the substrate 400 and the deposition source 110 are positioned such that deposition is performed in an area of the substrate where the second non-deposition region 402 is located, the second blocking member 162 is maintained in a fixed position relative to the second non-deposition region 402. The first blocking member 161 may be moved after deposition has been performed in an area of the substrate where the first non-deposition region 401 is located, but at such a time, the first blocking member is not moved to be positioned between the deposition source 110 and the substrate 400. That is, positions of the first blocking member 161 and the second blocking member 162 relative to each other continuously change, and the positions of the first blocking member 161 and the second blocking member 162 relative to the substrate 400 also continuously change such that the first blocking member 161 and the second blocking member 162 perform their respective blocking functions but do not take up as much space when deposition an area including the first deposition region 401 or second deposition region 402 is not being performed.

In this regard, the cross-sections of the first and second blocking members 161 and 162 may have a U shape in order to prevent the deposition material 115 from being deposited on the first and second non-deposition regions 401 and 402 by blocking the deposition material 115 incident from the side of the first and second blocking members 161 and 162 from reaching the first and second non-deposition regions 401 and 402.

However, as described above, in order to minimize the space occupied by the first and second blocking members 161 and 162 in the chamber, at least one side of one of the first and second blocking members 161 and 162 may be open. That is, as shown in FIGS. 6A to 6D, the first blocking member 161 may have a U-shaped cross-section, and the second blocking member 162 may have an L-shaped cross-section so that one side of the second blocking member 162 is open. Due to the configurations of the first and second blocking members 161 and 162, the first and second blocking members 161 and 162 may be overlapped or nested with each other when deposition is not being performed on the substrate 400. As shown in FIG. 6D, the first and second blocking members 161 and 162 may be returned to an overlapping position when deposition has finished. Moreover, in a chamber that has a plurality of thin film deposition apparatuses, the first and second blocking members 161 and 162 may be repositioned to the starting position shown in FIG. 6A to block the first and second non-deposition regions 401 and 402 for subsequent deposition procedures.

Since the first and second non-deposition regions 401 and 402 are screened by the first and second blocking members 161 and 162, the organic material may be prevented from being deposited on the first and second non-deposition regions 401 and 402 of the substrate 400 without the necessity of providing another structure. In addition, the pathway of the first and second blocking members 161 and 162 may be reduced, and space utilization in the chamber may be improved.

FIG. 7 is a schematic perspective view of a thin film deposition apparatus according to another embodiment of the present invention.

Referring to FIG. 7, the thin film deposition apparatus 500 according to the current embodiment of the present invention includes a deposition source 510, a deposition source nozzle unit 520, a first barrier plate assembly 530, a second barrier plate assembly 540, a patterning slit sheet 550, and first and second blocking members 561 and 562.

Although a chamber is not illustrated in FIG. 7 for convenience of explanation, all the components of the thin film deposition apparatus 500 may be disposed within a chamber that is maintained at an appropriate degree of vacuum. The chamber is maintained at an appropriate vacuum in order to allow a deposition material 115 to move in a straight direction.

The substrate 400, which constitutes a deposition target on which the deposition material 515 is to be deposited, is disposed in the chamber. The deposition source 510 that contains and heats the deposition material 515 is disposed in the chamber at a side of the thin film deposition apparatus 500 that is opposite to and spaced apart from the substrate 400.

Since the deposition source 510 and the patterning slit sheet 550 are the same as those described with reference to FIG. 1, the description thereof will not repeated herein. In addition, since the first barrier plate assembly 530 is the same as that described with reference to FIG. 1, the description thereof will not be repeated herein.

The second barrier plate assembly 540 is disposed at a side of the first barrier plate assembly 530. The second barrier plate assembly 540 includes a plurality of second barrier plates 541, and a second barrier plate frame 542 that covers sides of the second barrier plates 541.

The plurality of second barrier plates 541 may be arranged parallel to each other at equal intervals in the X-axis direction. In addition, each of the second barrier plates 541 may be formed to extend in the YZ plane in FIG. 7, i.e., perpendicular to the X-axis direction.

The plurality of first barrier plates 531 and second barrier plates 541 arranged as described above partition the space between the deposition source nozzle unit 520 and the patterning slit sheet 550. In the thin film deposition apparatus 500 according to the current embodiment of the present invention, the deposition space is divided by the first barrier plates 531 and the second barrier plates 541 into sub-deposition spaces that respectively correspond to the deposition source nozzles 521 through which the deposition material 515 is discharged.

The second barrier plates 541 may be disposed to correspond respectively to the first barrier plates 531. In other words, the second barrier plates 541 may be respectively disposed to be parallel to and to be on the same plane as the first barrier plates 531. Each pair of the corresponding first and second barrier plates 531 and 541 may be located on the same plane. Although the first barrier plates 531 and the second barrier plates 541 are respectively illustrated as having the same thickness in the X-axis direction, the present invention is not limited thereto. In other words, the second barrier plates 541, which may be accurately aligned with the patterning slit sheet 551, may be formed to be relatively thin, whereas the first barrier plates 531, which do not need to be precisely aligned with the patterning slit sheet 550, may be formed to be relatively thick. This makes it easier to manufacture the thin film deposition apparatus 500.

The first and second blocking members 561 and 562 of the thin film deposition apparatus 500 according to the present embodiment are moved along with the substrate 400 and screen first and second non-deposition regions 401 and 402 of the substrate 400 so as to prevent the organic material from being deposited on the first and second non-deposition regions 401 and 402 of the substrate 400. The first and second blocking members 561 and 562 are also the same as the first and second blocking members 161 and 162 described with FIGS. 5A to 5D and 6A to 6D, and thus the description thereof will not be repeated herein.

Figure 8:
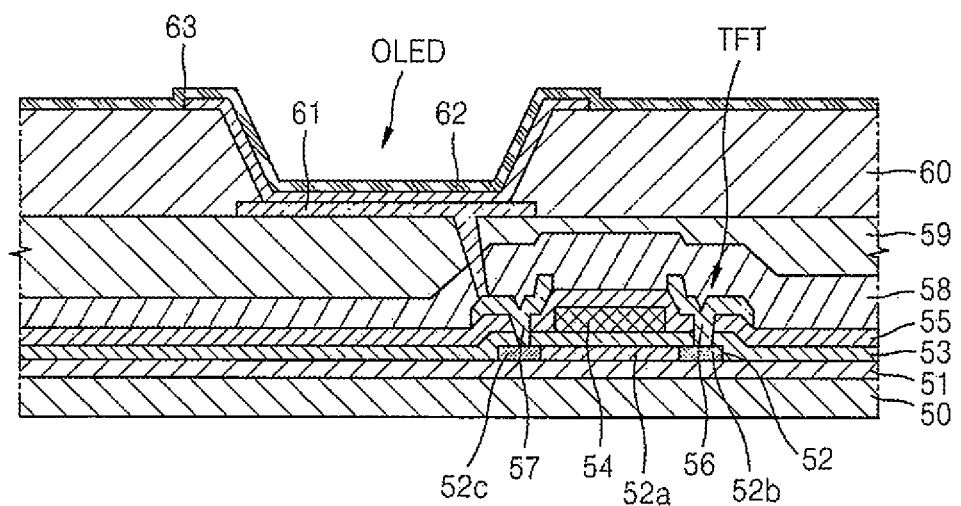
FIG. 8 is a cross-sectional view of an organic light-emitting display device manufactured by using a thin film deposition apparatus according to an embodiment of the present invention.

FIG. 8 is a cross-sectional view of an active-matrix organic light-emitting display device manufactured by using a thin film deposition apparatus according to an embodiment of the present invention. It is to be understood that where is stated herein that one layer is "formed on" or "disposed on" a second layer, the first layer may be formed or disposed directly on the second layer or there may be intervening layers between the first layer and the second layer. Further, as used herein, the term "formed on" is used with the same meaning as "located on" or "disposed on" and is not meant to be limiting regarding any particular fabrication process.

Referring to FIG. 8, a buffer layer 51 is formed on a substrate 50 formed of glass or plastic. A TFT and an OLED are formed on the buffer layer 51.

An active layer 52 having a predetermined pattern is formed on the buffer layer 51. A gate insulating layer 53 is formed on the active layer 52, and a gate electrode 54 is formed in a predetermined region of the gate insulating layer 53. The gate electrode 54 is connected to a gate line (not shown) that applies a TFT ON/OFF signal. An interlayer insulating layer 55 is formed on the gate electrode 54. Source/drain electrodes 56 and 57 are formed such as to contact source/drain regions 52a and 52c, respectively, of the active layer 52 through contact holes. A passivation layer 58 is formed of $SiO_2$, $SiN_x$, etc. on the source/drain electrodes 56 and 57. A planarization layer 59 is formed of an organic material, such as acryl, polyimide, benzocyclobutene (BCB), etc., on the passivation layer 58. A pixel electrode 61, which functions as an anode of the OLED, is formed on the planarization layer 59, and a pixel defining layer 60 formed of an organic material is formed to cover the pixel electrode 61. An opening is formed in the pixel defining layer 60, and then an organic layer 62 is formed on a surface of the pixel defining layer 60 and on a surface of the pixel electrode 61 exposed through the opening. The organic layer 62 includes an emission layer. The present invention is not limited to the structure of the organic light-emitting display device described above, and various structures of organic light-emitting display devices may be applied to the various aspects of the present invention.

The OLED displays predetermined image information by emitting red, green and blue light as current flows. The OLED includes the pixel electrode 61, which is connected to the drain electrode 56 of the TFT and to which a positive power voltage is applied, a counter electrode 63, which is formed so as to cover the entire sub-pixel and to which a negative power voltage is applied, and the organic layer 62, which is disposed between the pixel electrode 61 and the counter electrode 63 to emit light.

The pixel electrode 61 and the counter electrode 63 are insulated from each other by the organic layer 62, and respectively apply voltages of opposite polarities to the organic layer 62 to induce light emission in the organic layer 62.

The organic layer 62 may include a low-molecular weight organic layer or a high-molecular weight organic layer. When a low-molecular weight organic layer is used as the organic layer 62, the organic layer 62 may have a single or multi-layer structure including at least one selected from the group consisting of a hole injection layer (HIL), a hole transport layer (HTL), an emission layer (EML), an electron transport layer (ETL), an electron injection layer (EIL), etc. Examples of available organic materials include copper phthalocyanine (CuPc), N,N'-di(naphthalene-1-yl)-N,N'-diphenyl-benzidine (NPB), tris-8-hydroxyquinoline aluminum (Alq3), etc. The low-molecular weight organic layer may be formed by vacuum deposition.

When a high-molecular weight organic layer is used as the organic layer 62, the organic layer 62 may mostly have a structure including a HTL and an EML. In this case, the HTL may be formed of poly(ethylenedioxythiophene) (PEDOT), and the EML may be formed of polyphenylenevinylenes (PPVs) or polyfluorenes. The HTL and the EML may be formed by screen printing, inkjet printing, or the like.

The organic layer 62 is not limited to the organic layers described above, and may be embodied in various ways.

The pixel electrode 61 may function as an anode, and the counter electrode 63 may function as a cathode. Alternatively, the pixel electrode 61 may function as a cathode, and the counter electrode 63 may function as an anode.

The pixel electrode 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer.

The counter electrode 63 may be formed as a transparent electrode or a reflective electrode. When the counter electrode 63 is formed as a transparent electrode, the counter electrode 63 functions as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 62 and forming an auxiliary electrode layer or a bus electrode line thereon from a transparent electrode forming material, such as ITO, IZO, ZnO, $In_2O_3$, or the like. When the counter electrode 63 is formed as a reflective electrode, the reflective layer may be formed by depositing Li, Ca, LiF/Ca, LiF/Al, Al, Ag, Mg, or a compound thereof on the entire surface of the organic layer 62.

In the organic light-emitting display apparatus described above, the organic layer 62 including the emission layer may be formed by using any of the embodiments of a thin film deposition apparatus described herein or by using a chamber including a plurality of such thin film deposition apparatuses. The thin film deposition apparatus may also be used to form an organic layer or inorganic layer of an organic TFT, and other layers formed of various material.

It is to be understood that the organic light-emitting display device may vary from what is described above.

Figure 9:
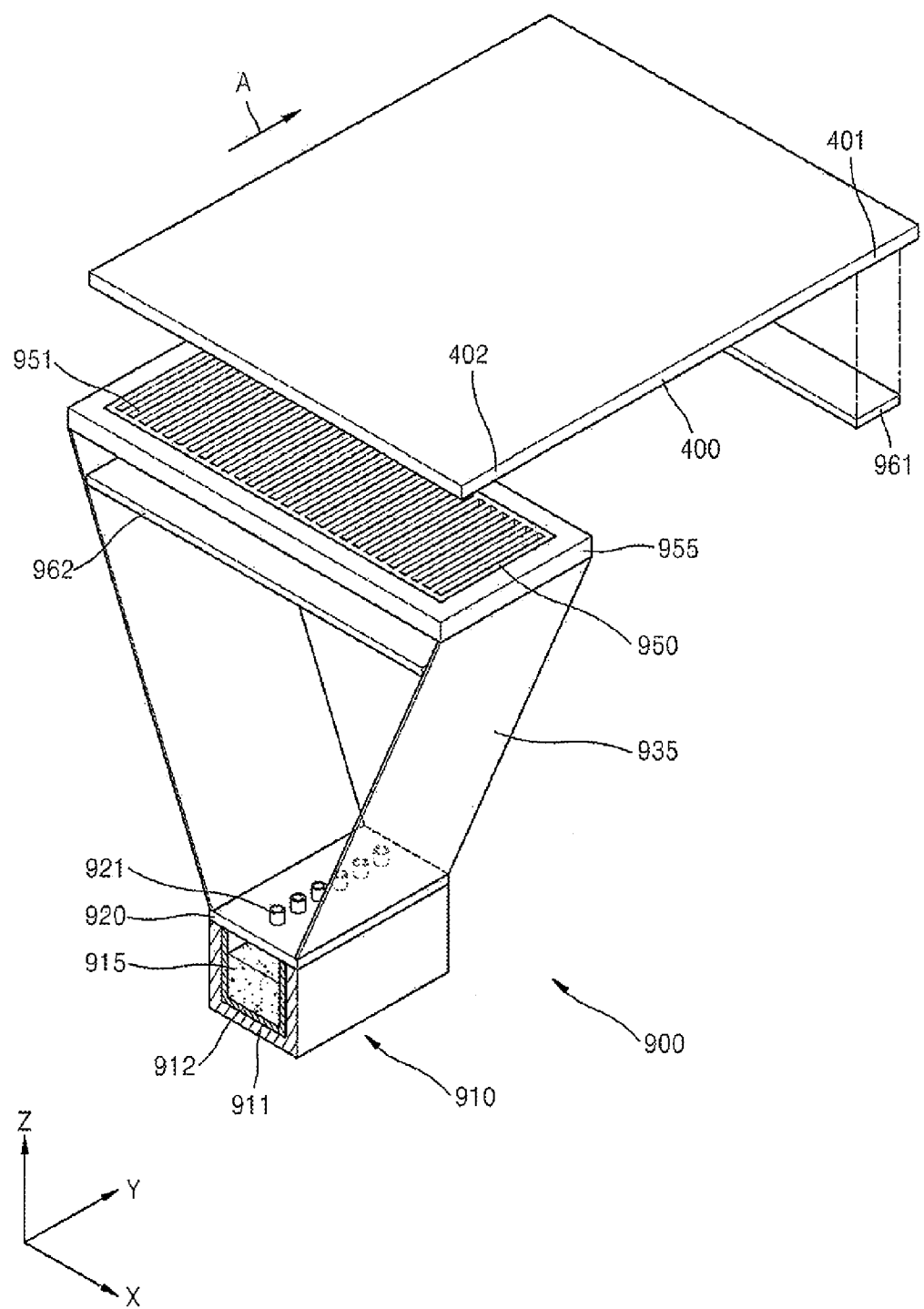
FIG. 9 is a schematic perspective view of a thin film deposition apparatus according to another embodiment of the present invention.
Figure 10:
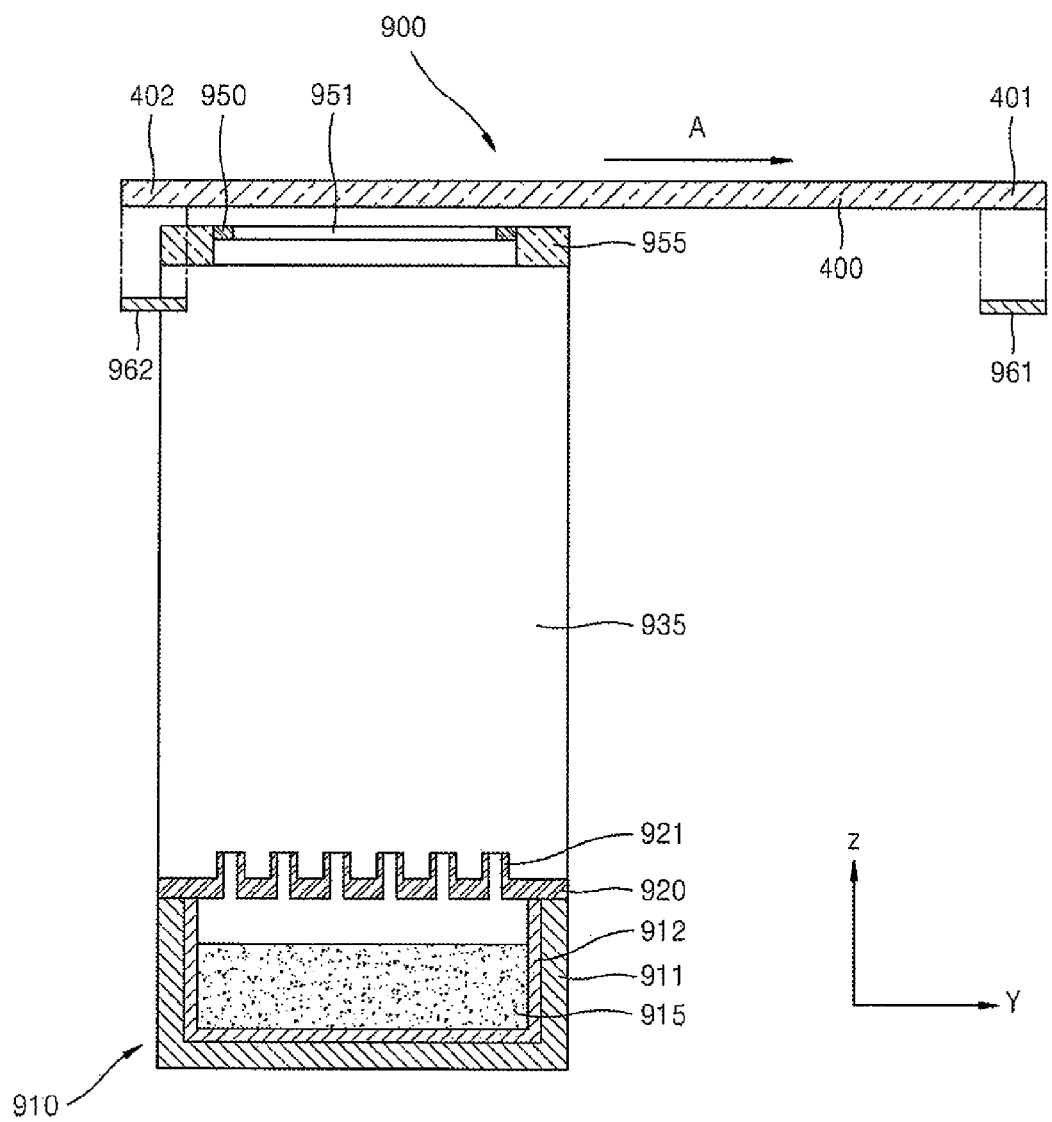
FIG. 10 is a schematic side view of the thin film deposition apparatus of FIG. 9.
Figure 11:
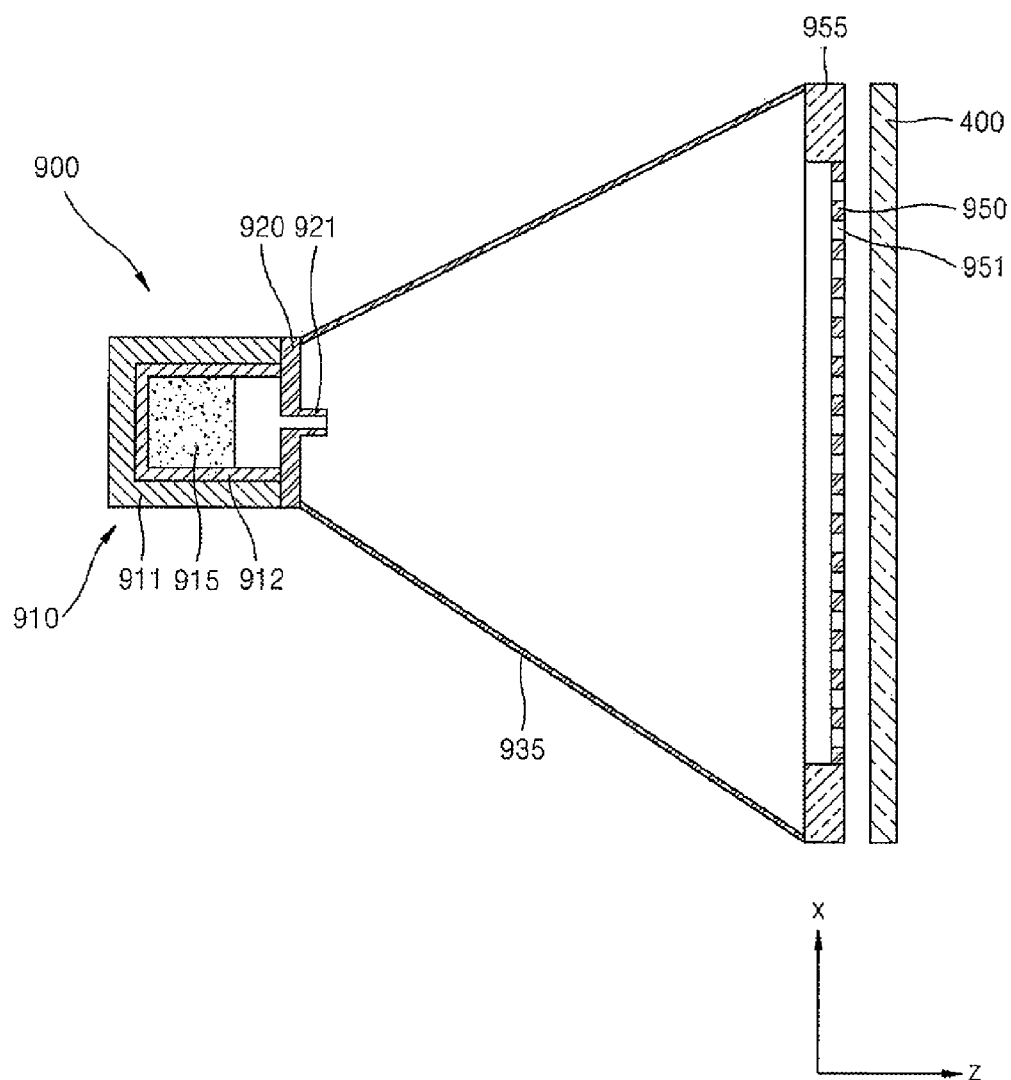
FIG. 11 is a schematic plan view of the thin film deposition apparatus of FIG. 9.

FIG. 9 is a schematic perspective view of a thin film deposition apparatus according to another embodiment of the present invention, FIG. 10 is a schematic side view of the thin film deposition apparatus of FIG. 9, and FIG. 11 is a schematic plan view of the thin film deposition apparatus of FIG. 9.

Referring to FIGS. 9, 10, and 11, the thin film deposition apparatus 900 according to the current embodiment of the present invention includes a deposition source 910, a deposition source nozzle unit 920, a patterning slit sheet 950, and blocking members 961 and 962.

Although a chamber is not illustrated in FIGS. 9, 10 and 11 for convenience of explanation, all the components of the thin film deposition apparatus 900 may be disposed within a chamber that is maintained at an appropriate degree of vacuum. The chamber is maintained at an appropriate vacuum in order to allow a deposition material to move in a substantially straight line through the thin film deposition apparatus 100.

In particular, in order to deposit a deposition material 915 that is emitted from the deposition source 910 and is discharged through the deposition source nozzle unit 920 and the patterning slit sheet 950, onto a substrate 400 in a desired pattern, it is required to maintain a chamber (not shown) in a high-vacuum state as in a deposition method using a fine metal mask (FMM). In addition, the temperature of the patterning slit sheet 950 have to be sufficiently lower than the temperature of the deposition source 910. In this regard, the temperature of the patterning slit sheet 950 may be about 100° C. or less. This is because thermal expansion of the patterning slit sheet 950 may be minimized when the temperature of the patterning slit sheet 950 is sufficiently low.

The substrate 400, which constitutes a deposition target on which a deposition material 915 is to be deposited, is disposed in the chamber. The substrate 400 may be a substrate for flat panel displays. A large substrate, such as a mother glass, for manufacturing a plurality of flat panel displays, may be used as the substrate 400. Other substrates may also be employed.

In the current embodiment of the present invention, deposition may be performed while the substrate 400 and the thin film deposition assembly 900 are moved relative to each other.

In particular, in the conventional FMM deposition method, the size of the FMM has to be equal to the size of a substrate. Thus, the size of the FMM has to be increased when performing deposition on a larger substrate. However, it is difficult to manufacture a large FMM and to extend an FMM to be accurately aligned with a pattern.

In order to overcome this problem, in the thin film deposition assembly 900 according to the current embodiment of the present invention, deposition may be performed while the thin film deposition assembly 900 and the substrate 400 are moved relative to each other. In other words, deposition may be continuously performed while the substrate 400, which is disposed such as to face the thin film deposition assembly 900, is moved in a Y-axis direction. In other words, deposition is performed in a scanning manner while the substrate 400 is moved in a direction of an arrow A in FIG. 9. Although the substrate 400 is illustrated as being moved in the Y-axis direction in FIG. 9 when deposition is performed, the present invention is not limited thereto. Deposition may be performed while the thin film deposition assembly 900 is moved in the Y-axis direction, whereas the substrate 400 is fixed.

Thus, in the thin film deposition assembly 900 according to the current embodiment of the present invention, the patterning slit sheet 950 may be significantly smaller than an FMM used in a conventional deposition method. In other words, in the thin film deposition assembly 900 according to the current embodiment of the present invention, deposition is continuously performed, i.e., in a scanning manner while the substrate 400 is moved in the Y-axis direction. Thus, lengths of the patterning slit sheet 950 in the X-axis and Y-axis directions may be significantly less than the lengths of the substrate 400 in the X-axis and Y-axis directions. As described above, since the patterning slit sheet 950 may be formed to be significantly smaller than an FMM used in a conventional deposition method, it is relatively easy to manufacture the patterning slit sheet 950 used in an embodiment of the present invention. In other words, using the patterning slit sheet 950, which is smaller than an FMM used in a conventional deposition method, is more convenient in all processes, including etching and subsequent other processes, such as precise extension, welding, moving, and cleaning processes, compared to the conventional deposition method using the larger FMM. This is more advantageous for a relatively large display device.

In order to perform deposition while the thin film deposition assembly 900 or the substrate 400 is moved relative to each other as described above, the thin film deposition assembly 900 and the substrate 400 may be separated from each other by a predetermined distance. This will be described later in detail.

The deposition source 910 that contains and heats the deposition material 915 is disposed in an opposite side of the chamber to that in which the substrate 400 is disposed. As the deposition material 915 contained in the deposition source 910 is vaporized, the deposition material 915 is deposited on the substrate 400.

In particular, the deposition source 910 includes a crucible 911 that is filled with the deposition material 915, and a heater 912 that heats the crucible 911 to vaporize the deposition material 915, which is contained in the crucible 911, towards a side of the crucible 911, and in particular, towards the deposition source nozzle unit 920.

The deposition source nozzle unit 920 is disposed at a side of the deposition source 910, and in particular, at the side of the deposition source 910 facing the substrate 400. The deposition source nozzle unit 920 includes a plurality of deposition source nozzles 921 arranged at equal intervals in the Y-axis direction, i.e., the scanning direction of the substrate 400. The deposition material 915 that is vaporized in the deposition source 910, passes through the deposition source nozzle unit 920 towards the substrate 400. As described above, when the plurality of deposition source nozzles 921 are formed on the deposition source nozzle unit 920 in the Y-axis direction, that is, the scanning direction of the substrate 400, a size of the pattern formed by the deposition material 915 that is discharged through each of patterning slits 951 in the patterning slit sheet 950 is only affected by the size of one deposition source nozzle 921, that is, it may be considered that one deposition nozzle 921 exists in the X-axis direction, and thus there is no shadow zone on the substrate. In addition, since the plurality of deposition source nozzles 921 are formed in the scanning direction of the substrate 400, even there is a difference between fluxes of the deposition source nozzles 921, the difference may be compensated and deposition uniformity may be maintained constantly.

The patterning slit sheet 950 and a frame 955 in which the patterning slit sheet 950 is bound are disposed between the deposition source 910 and the substrate 400. The frame 955 may be formed in a lattice shape, similar to a window frame. The patterning slit sheet 950 is bound inside the frame 955. The patterning slit sheet 950 includes a plurality of patterning slits 951 arranged in the X-axis direction. The deposition material 915 that is vaporized in the deposition source 910, passes through the deposition source nozzle unit 920 and the patterning slit sheet 950 towards the substrate 400. The patterning slit sheet 950 may be manufactured by etching, which is the same method as used in a conventional method of manufacturing an FMM, and in particular, a striped FMM. Here, the total number of patterning slits 951 may be greater than the total number of deposition source nozzles 921.

The deposition source 910 (and the deposition source nozzle unit 920 coupled to the deposition source 910) and the patterning slit sheet 950 may be formed to be separated from each other by a predetermined distance. Alternatively, the deposition source 910 (and the deposition source nozzle unit 920 coupled to the deposition source 910) and the patterning slit sheet 950 may be connected to each other by a connection member 935. That is, the deposition source 910, the deposition source nozzle unit 920, and the patterning slit sheet 950 may be formed integrally with each other by being connected to each other via the connection member 935. The connection member 935 guides the deposition material 915, which is discharged through the deposition source nozzles 921, to move straight, not to flow in the X-axis direction. In FIGS. 9 through 11, the connection members 935 are formed on left and right sides of the deposition source 910, the deposition source nozzle unit 920, and the patterning slit sheet 950 to guide the deposition material 915 not to flow in the X-axis direction, however, the present invention is not limited thereto. That is, the connection member 935 may be formed as a sealed type of a box shape to guide flow of the deposition material 115 in both the X-axis and the Y-axis directions.

As described above, the thin film deposition apparatus 900 according to the current embodiment of the present invention performs deposition while being moved relative to the substrate 400. In order to move the thin film deposition apparatus 900 relative to the substrate 400, the patterning slit sheet 950 is separated from the substrate 400 by a predetermined distance.

In particular, in a conventional deposition method using an FMM, deposition is performed with the FMM in close contact with a substrate in order to prevent formation of a shadow zone on the substrate. However, when the FMM is used in close contact with the substrate, the contact may cause defects. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In order to overcome this and/or other problems, in the thin film deposition apparatus 900 according to the current embodiment of the present invention, the patterning slit sheet 950 is disposed to be separated from the substrate 400 by a predetermined distance.

As described above, according to the aspects of the present invention, a mask is formed to be smaller than a substrate, and deposition is performed while the mask is moved relative to the substrate. Thus, the mask can be easily manufactured. In addition, defects caused due to the contact between a substrate and an FMM, which occurs in the conventional deposition method, may be prevented. In addition, since it is unnecessary to use the FMM in close contact with the substrate during a deposition process, the manufacturing speed may be improved.

In this regard, in the thin film deposition apparatus 900 according to the current embodiment of the present invention, the first and second blocking members 961 and 962 are disposed to move along with the substrate 400 and screen the first and second non-deposition regions 401 and 402 of the substrate 400 so that a deposition material 915 is prevented from being deposited on the first and second non-deposition regions 401 and 402 of the substrate 400. Since this has been described with reference to the previous embodiment, the description thereof will not be repeated herein.

Figure 12:
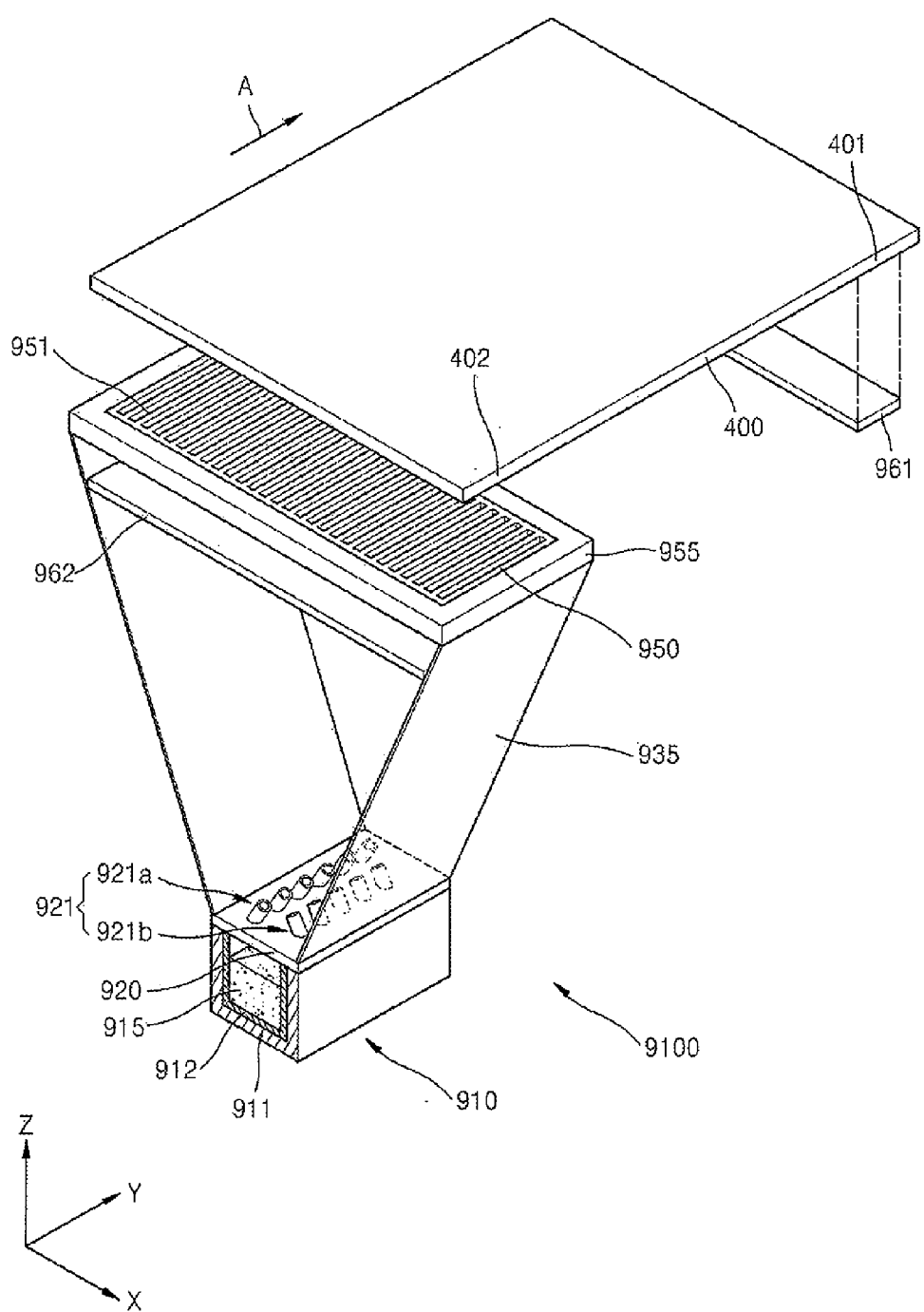
FIG. 12 is a schematic perspective view of a thin film deposition apparatus according to another embodiment of the present invention.

FIG. 12 is a schematic perspective view of a thin film deposition apparatus according to another embodiment of the present invention. Referring to FIG. 12, the thin film deposition apparatus according to the current embodiment of the present invention includes a deposition source 910, a deposition source nozzle unit 920, and a patterning slit sheet 950. In particular, the deposition source 910 includes a crucible 911 that is filled with the deposition material 915, and a heater 912 that heats the crucible 911 to vaporize the deposition material 915, which is contained in the crucible 911, towards a side of the crucible 111, and in particular, towards the deposition source nozzle unit 920. The deposition source nozzle unit 920, which has a planar shape, is disposed at a side of the deposition source 910. The deposition source nozzle unit 920 includes a plurality of deposition source nozzles 921 arranged in the Y-axis direction. The patterning slit sheet 950 and a frame 955 are further disposed between the deposition source 910 and the substrate 400, and the patterning slit sheet 950 includes a plurality of patterning slits 951 arranged in the X-axis direction. In addition, the deposition source 910, the deposition source nozzle unit 920, and the patterning slit sheet 950 are connected to each other by the connection member 935.

In the current embodiment of the present invention, the plurality of deposition source nozzles 921 formed on the deposition source nozzle unit 920 are tilted at a predetermined angle. In particular, the deposition source nozzles 921 may include deposition source nozzles 921a and 921b which are arranged in two rows, which are alternately arranged with each other. Here, the deposition source nozzles 921a and 921b may be tilted at a predetermined angle on an X-Z plane.

Therefore, in the current embodiment of the present invention, the deposition source nozzles 921a and 921b are arranged in tilted states at a predetermined angle. Here, the deposition source nozzles 921a in a first row may be tilted at the predetermined angle toward the deposition nozzles 921b in a second row, and the deposition source nozzles 921b in the second row may be tilted at the predetermined angle toward the deposition source nozzles 921a in the first row. That is, the deposition source nozzles 921a arranged in the row at the left side of the patterning slit sheet 950 are arranged to face the right side of the patterning slit sheet 950, and the deposition source nozzles 921b arranged in the row at the right side of the patterning slit sheet 950 are arranged to face the left side of the patterning slit sheet 950.

Figure 13:
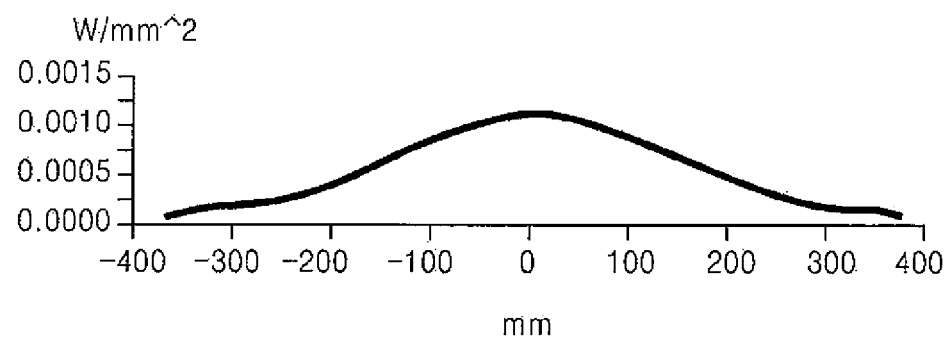
FIG. 13 is a graph schematically illustrating a distribution pattern of a deposition film formed on a substrate when a deposition source nozzle is not tilted, in a thin film deposition apparatus according to an embodiment of the present invention.
Figure 14:
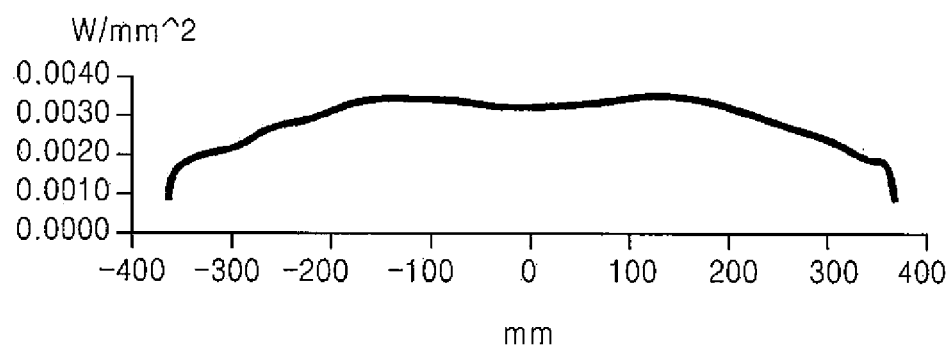
FIG. 14 is a graph schematically illustrating a distribution pattern of a deposition film formed on a substrate when a deposition source nozzle is tilted, in a thin film deposition apparatus according to an embodiment of the present invention.

FIG. 13 is a graph schematically illustrating a distribution pattern of a deposition film formed on a substrate when a deposition source nozzle is not tilted, in a thin film deposition apparatus according to an embodiment of the present invention, and FIG. 14 is a graph schematically illustrating a distribution pattern of a deposition film formed on a substrate when a deposition source nozzle is tilted, in a thin film deposition apparatus according to an embodiment of the present invention.

Comparing the graphs of FIGS. 13 and 14 with each other, thickness of both end portions of the deposition film formed on the substrate when the deposition source nozzles are tilted is relatively greater than that of the deposition film formed on the substrate when the deposition source nozzles are not tilted, and thus, the uniformity of the deposition film is improved.

Therefore, the deposition amount of the deposition material may be adjusted so that a thickness difference between the center portion and end portions of the deposition film formed on the substrate may be reduced and the entire thickness of the deposition film may be constant, and moreover, the efficiency of utilizing the deposition material may be improved.

In this regard, in the thin film deposition apparatus 900 according to the current embodiment of the present invention, the first and second blocking members 961 and 962 are disposed to move along with the substrate 400 and screen the first and second non-deposition regions 401 and 402 of the substrate 400 so that an deposition material 915 is prevented from being deposited on the first and second non-deposition regions 401 and 402 of the substrate 400. Since this has been described with reference to the previous embodiment, the description thereof will not be repeated herein.

As described above, the thin film deposition apparatus according to the aspects of the present invention may be easily manufactured and may be simply applied to produce large substrates on a mass scale. The thin film deposition apparatus may improve manufacturing yield and deposition efficiency and may allow deposition materials to be reused.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method for forming a thin film on a substrate, the method comprising:
    discharging a deposition material from a deposition source through a plurality of deposition source nozzles arranged in a first direction on a deposition source nozzle unit disposed at a side of the deposition source;
    passing the discharged deposition material through a patterning slit sheet; and
    depositing the passed deposition material on the substrate without any intervening elements between the patterning slit sheet and the substrate, while moving at least one of the substrate and the patterning slit sheet relative to the other,
    wherein the patterning slit sheet is spaced apart from the substrate by a distance, and a blocking member is disposed between the substrate and the deposition source and is positioned to screen at least one portion of the substrate, such that when at least one of the substrate and the patterning slit sheet is moved, the position of the blocking member with respect to the substrate is constantly maintained, and
    wherein the patterning slit sheet is disposed opposite to and spaced apart from the deposition source nozzle unit, and comprises a plurality of patterning slits arranged in the first direction,
    wherein the patterning slit sheet is between the substrate and the blocking member.

2. The method of claim 1, wherein the blocking member comprises a first blocking member that screens a first non-deposition region formed at a first end of the substrate and a second blocking member that screens a second non-deposition region formed at a second end of the substrate.

3. The method of claim 2, wherein when the substrate is moved, the first and second blocking members are moved along with the substrate and at the same speed as that of the substrate, such that the first blocking member is disposed to block deposition on the first non-deposition region, and the second blocking member is disposed to block deposition on the second non-deposition region.

4. The method of claim 3, wherein positions of the first and second blocking members with respect to the substrate are constantly maintained.

5. The method of claim 1, wherein the patterning slit sheet is smaller than the substrate.

6. The method of claim 1, wherein the forming a thin film on a substrate further comprises passing the deposition material through a barrier plate assembly disposed between the deposition source nozzle unit and the patterning slit sheet, the barrier plate assembly comprising a plurality of barrier plates in the first direction that partition a space between the deposition source nozzle unit and the patterning slit sheet into a plurality of sub-deposition spaces.

7. A method for forming a thin film on a substrate, the method comprising:
- discharging a deposition material from a deposition source through a plurality of deposition source nozzles arranged in a first direction on a deposition source nozzle unit disposed at a side of the deposition source;
- passing the discharged deposition material through a patterning slit sheet; and
- depositing the passed deposition material on the substrate without any intervening elements between the patterning slit sheet and the substrate, while moving at least one of the substrate and the patterning slit sheet relative to the other in the first direction,
- wherein a blocking member is disposed between the substrate and the deposition source and is positioned to screen at least one portion of the substrate, such that when at least one of the substrate and the patterning slit sheet is moved, the position of the blocking member with respect to the substrate is constantly maintained, and
- the patterning slit sheet is disposed opposite to the deposition source nozzle unit and comprises a plurality of patterning slits arranged in a second direction perpendicular to the first direction,
- wherein the patterning slit sheet is between the substrate and the blocking member.

8. The method of claim 7, wherein the blocking member comprises a first blocking member that screens a first non-deposition region formed at a first end of the substrate and a second blocking member that screens a second non-deposition region formed at a second end of the substrate.

9. The method of claim 8, wherein when the substrate is moved, the first and second blocking members are moved along with the substrate and at the same speed as that of the substrate, such that the first blocking member is disposed to block deposition on the first non-deposition region, and the second blocking member is disposed to block deposition on the second non-deposition region.

10. The method of claim 9, wherein positions of the first and second blocking members with respect to the substrate are constantly maintained.

11. The method of claim 7, wherein the deposition source and the deposition source nozzle unit, and the patterning slit sheet are connected to each other by a connection member.

12. The method of claim 11, wherein the connection member guides movement of the discharged deposition material.

13. The method of claim 11, wherein the connection member seals a portion of a space between the deposition source and the deposition source nozzle unit, and the patterning slit sheet.

14. The method of claim 7, wherein the patterning slit sheet is spaced apart from the substrate by a distance.

15. The method of claim 7, wherein the patterning slit sheet is smaller than the substrate.

16. A method for forming a thin film on a substrate, the method comprising:
- discharging a deposition material from a deposition source;
- passing the discharged deposition material through a plurality of patterning slits on a patterning slit sheet; and
- depositing the passed deposition material on the substrate without any intervening elements between the patterning slit sheet and the substrate, while moving at least one of the substrate and the patterning slit sheet relative to the other, wherein a blocking member is positioned between the substrate and the deposition source to screen a non-deposition region of the substrate, such that when at least one of the substrate and the patterning slit sheet is moved, the blocking member maintains a constant screening position with respect to the non-deposition region of the substrate, and
- wherein the patterning slit sheet is disposed to face and spaced apart from the deposition source, and the plurality of patterning slits is arranged in a first direction,
- wherein the patterning slit sheet is between the substrate and the blocking member.

17. The method of claim 16, wherein the blocking member comprises a first blocking member that screens a first non-deposition region formed at a first end of the substrate and a second blocking member that screens a second non-deposition region formed at a second end of the substrate.

* * * * *